(12) United States Patent
Kawato et al.

(10) Patent No.: US 9,231,210 B2
(45) Date of Patent: Jan. 5, 2016

(54) MANUFACTURING DEVICE AND MANUFACTURING METHOD FOR ORGANIC EL ELEMENT

(75) Inventors: Shinichi Kawato, Osaka (JP); Nobuhiro Hayashi, Osaka (JP); Tohru Sonoda, Osaka (JP); Satoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 592 days.

(21) Appl. No.: 13/696,585

(22) PCT Filed: May 2, 2011

(86) PCT No.: PCT/JP2011/060514
§ 371 (c)(1),
(2), (4) Date: Nov. 6, 2012

(87) PCT Pub. No.: WO2011/145456
PCT Pub. Date: Nov. 24, 2011

(65) Prior Publication Data
US 2013/0059063 A1   Mar. 7, 2013

(30) Foreign Application Priority Data

May 18, 2010   (JP) .................................. 2010-114556

(51) Int. Cl.
*H05B 33/10*   (2006.01)
*H01L 51/00*   (2006.01)
(Continued)

(52) U.S. Cl.
CPC ............ *H01L 51/001* (2013.01); *C23C 14/042* (2013.01); *C23C 14/12* (2013.01); *C23C 14/24* (2013.01); *H01L 27/3211* (2013.01); *H01L 51/56* (2013.01)

(58) Field of Classification Search
CPC ...................................................... C23C 14/042
See application file for complete search history.

(56) References Cited

U.S. PATENT DOCUMENTS

| 5,742,129 A | 4/1998 | Nagayama et al. |
| 6,294,892 B1 | 9/2001 | Utsugi et al. |

(Continued)

FOREIGN PATENT DOCUMENTS

| JP | 8-227276 A | 9/1996 |
| JP | 2000-188179 A | 7/2000 |

(Continued)

OTHER PUBLICATIONS

International Search Report received for PCT Patent Application No. PCT/JP2011/060514, mailed on Aug. 16, 2011, 5 pages (2 pages of English Translation and 3 pages of PCT Search Report).

*Primary Examiner* — Nathan T Leong
(74) *Attorney, Agent, or Firm* — Morrison & Foerster LLP

(57) ABSTRACT

A vapor deposition source (60), a plurality of limiting plates (81) and a vapor deposition mask (70) are disposed in this order. A substrate spaced apart from the vapor deposition mask at a fixed interval is moved relative to the vapor deposition mask. Vapor deposition particles (91) discharged from vapor deposition source openings (61) of the vapor deposition source pass through between neighboring limiting plates, pass through mask openings (71) formed in the vapor deposition mask, and adhere to the substrate, whereby coating films (90) are formed. The limiting plates limit the incidence angle of the vapor deposition particles that enter the mask openings, as viewed in the relative movement direction of the substrate. In this way, an organic EL element can be formed on a large-sized substrate without increasing the pixel pitch or reducing the aperture ratio.

17 Claims, 26 Drawing Sheets

(51) Int. Cl.
*C23C 14/04* (2006.01)
*C23C 14/12* (2006.01)
*C23C 14/24* (2006.01)
*H01L 27/32* (2006.01)
*H01L 51/56* (2006.01)

(56) References Cited

U.S. PATENT DOCUMENTS

| | | | |
|---|---|---|---|
| 2004/0115338 A1* | 6/2004 | Yoneda | C23C 14/042 427/66 |
| 2005/0263074 A1 | 12/2005 | Masuda et al. | |
| 2009/0181163 A1 | 7/2009 | Uetake | |
| 2009/0220691 A1 | 9/2009 | Kim | |
| 2010/0297348 A1* | 11/2010 | Lee et al. | C23C 14/24 427/248.1 |
| 2011/0053300 A1 | 3/2011 | Ryu et al. | |
| 2011/0168986 A1 | 7/2011 | Lee et al. | |
| 2012/0183676 A1 | 7/2012 | Sonoda et al. | |

FOREIGN PATENT DOCUMENTS

| | | |
|---|---|---|
| JP | 2004-103269 A | 4/2004 |
| JP | 2005-298971 A | 10/2005 |
| JP | 2005-344146 A | 12/2005 |
| JP | 2009-170200 A | 7/2009 |
| JP | 2009-203551 A | 9/2009 |
| JP | 2011-47035 A | 3/2011 |
| JP | 2011-146377 A | 7/2011 |
| WO | 2011/034011 A1 | 3/2011 |
| WO | 2011/096030 A1 | 8/2011 |
| WO | 2011/111134 A1 | 9/2011 |

\* cited by examiner

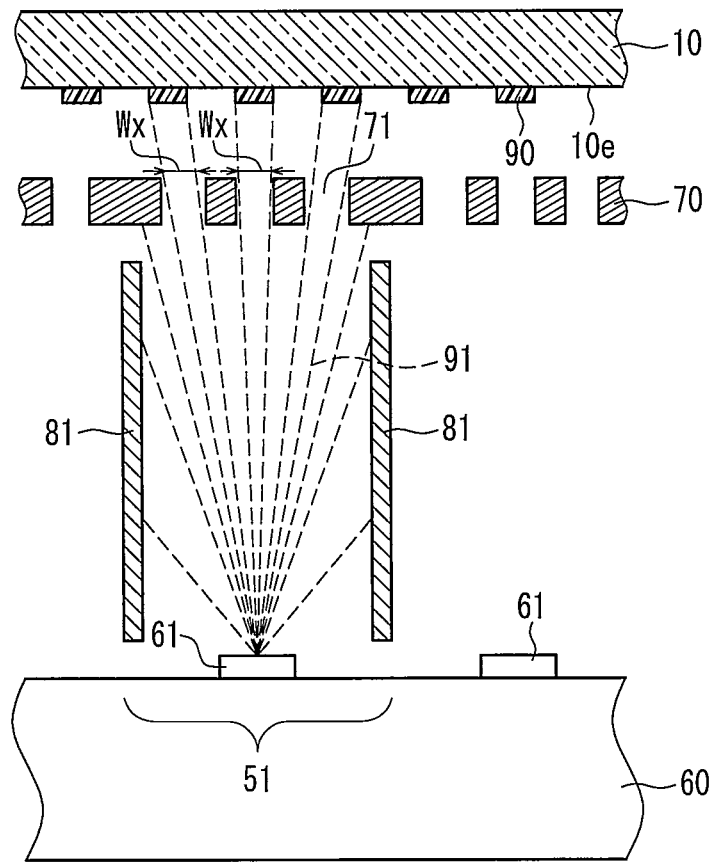
FIG. 11
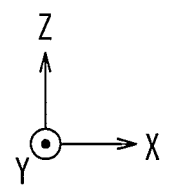

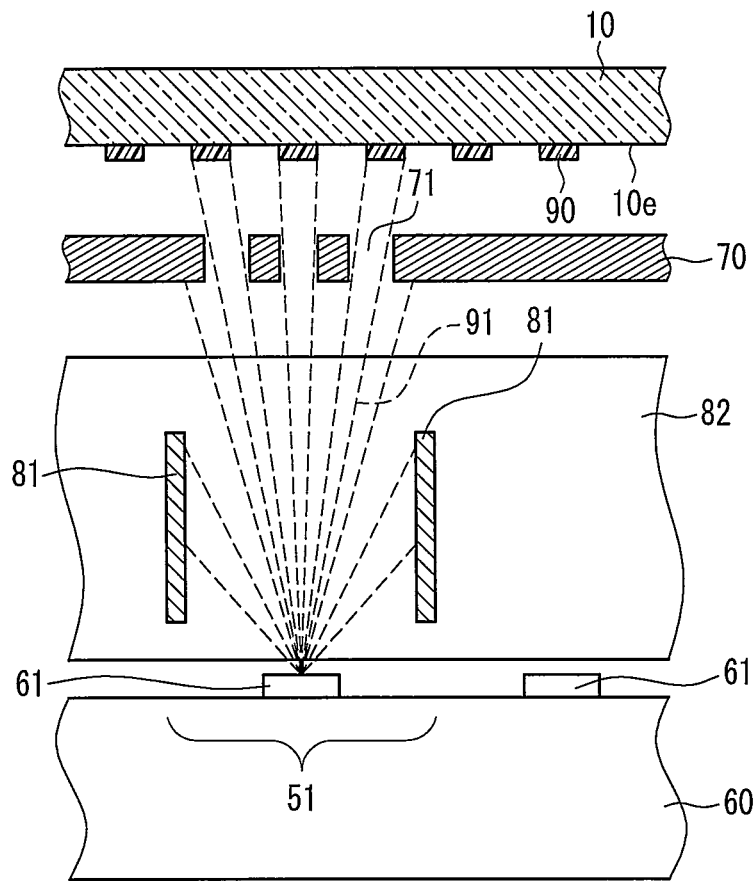
FIG. 15
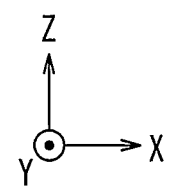

MANUFACTURING DEVICE AND MANUFACTURING METHOD FOR ORGANIC EL ELEMENT

CROSS REFERENCE TO RELATED APPLICATIONS

This is a U.S. National Phase patent application of PCT/JP2011/060514, filed May 2, 2011, which claims priority to Japanese Patent Application No. 2010-114556, filed May 18, 2010, each of which is hereby incorporated by reference in the present disclosure in its entirety.

TECHNICAL FIELD

The present invention relates to a manufacturing method and a manufacturing device for an organic EL (Electro Luminescence) element that can be used in, for example, an organic EL display or the like.

BACKGROUND ART

In recent years, flat panel displays are required to have a large size, high image quality and low power consumption. Under the circumstances, high-image quality organic EL displays, which can be driven at a low voltage, are attracting great attention. Full-color active matrix type organic EL displays, for example, are provided with a thin film-like organic EL element on a substrate having a TFT (thin film transistor). In the organic EL element, organic EL layers including red (R), green (G) and blue (B) light emitting layers are laminated between a pair of electrodes. The TFT is connected to one of the pair of electrodes. Then, voltage is applied across the pair of electrodes so as to cause each light emitting layer to emit light, whereby an image is displayed.

In order to manufacture an organic EL element, it is necessary to form light emitting layers made of organic light emitting materials that emit respective colors in a predetermined pattern.

Known methods for forming light emitting layers in a predetermined pattern are vacuum vapor deposition method, inkjet method and laser transfer method. For example, the vacuum vapor deposition method is often used for low molecular organic EL displays (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of thin films is formed. Vapor deposition is performed for each color of the light emitting layers, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

CITATION LIST

Patent Document

Patent Document 1: JP H8-227276 A
Patent Document 2: JP 2000-188179 A

DISCLOSURE OF INVENTION

Problem to be Solved by the Invention

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. For this reason, it is difficult to perform highly accurate patterning, and it is therefore difficult to achieve high definition due to the occurrence of positional offset of vapor deposition and the occurrence of color mixing.

Also, when the mask is made large, the mask as well as a frame or the like for holding the mask needs to be big, which increases the weight and makes handling thereof difficult. As a result, there is a possibility that productivity and safety might be compromised. Also, the vapor deposition device and devices that are used together therewith need to be made big and complex as well, which makes device designing difficult and increases the installation cost.

For the reasons described above, the conventional methods for vapor deposition by color are difficult to adapt to large-sized substrates, and no methods have been devised that can perform vapor deposition by color on large-sized substrates such as those having a size exceeding 60 inches on a mass production level.

Meanwhile, in addition to size increase, organic EL displays are also strongly required to have a high resolution and high brightness. To this end, it is necessary to reduce the pixel pitch of the organic EL element to increase the aperture ratio.

It is an object of the present invention to provide a manufacturing method and a manufacturing device for an organic EL element that can be applied to large-sized substrates, without increasing the pixel pitch or reducing the aperture ratio.

Means for Solving Problem

A method for manufacturing an organic EL element according to the present invention is a manufacturing method for an organic EL element including a coating film having a predetermined pattern on a substrate, the method including a vapor deposition step of forming the coating film by causing vapor deposition particles to adhere to the substrate. The vapor deposition step is a step in which with the use of a vapor deposition unit including a vapor deposition source having a vapor deposition source opening that discharges the vapor deposition particles and a vapor deposition mask disposed between the vapor deposition source opening and the substrate, in a state in which the substrate and the vapor deposition mask are spaced apart at a fixed interval, the vapor deposition particles that have passed through a plurality of mask openings formed in the vapor deposition mask are caused to adhere to the substrate while one of the substrate and the vapor deposition unit is moved relative to the other. When a relative movement direction between the substrate and the vapor deposition unit is defined as a first direction and a direction orthogonal to the first direction is defined as a second direction, the vapor deposition unit includes, between the vapor deposition source opening and the vapor deposition mask, a plurality of limiting plates whose positions in the second direction are different. Each of the plurality of limiting plates limits an incidence angle of the vapor deposition particles entering the respective mask openings, as viewed in the first direction.

A device for manufacturing an organic EL element according to the present invention is a manufacturing device for an organic EL element including a coating film having a predetermined pattern on a substrate, the device including: a vapor deposition unit including a vapor deposition source having a vapor deposition source opening that discharges vapor deposition particles for forming the coating film and a vapor deposition mask disposed between the vapor deposition source opening and the substrate; and a moving mechanism that moves one of the substrate and the vapor deposition unit relative to the other in a state in which the substrate and the vapor deposition mask are spaced apart by a fixed interval. A plurality of mask openings through which the vapor deposition particles discharged from the vapor deposition source opening pass are formed in the vapor deposition mask. When a relative movement direction between the substrate and the vapor deposition unit is defined as a first direction and a direction orthogonal to the first direction is defined as a second direction, the vapor deposition unit further includes, between the vapor deposition source opening and the vapor deposition mask, a plurality of limiting plates whose positions in the second direction are different Each of the plurality of limiting plates limits an incidence angle of the vapor deposition particles entering the respective mask openings, as viewed in the first direction.

Effects of the Invention

According to the present invention, the vapor deposition particles that have passed through the mask openings formed in the vapor deposition mask are caused to adhere to the substrate while one of the substrate and the vapor deposition unit is moved relative to the other, and therefore a vapor deposition mask that is smaller than the substrate can be used. Accordingly, stripe-shaped coating films can also be formed on a large-sized substrate by vapor deposition by color.

Also, the limiting plates limit the incidence angle of the vapor deposition particles entering the mask openings as viewed in the first direction, and therefore the traveling direction of the vapor deposition particles that pass through the mask openings can be managed. Accordingly, the occurrence of a blur at both edges of a stripe-shaped coating film can be suppressed even when the vapor deposition mask and the substrate are spaced apart from each other. As a result, the need to widen the interval between the stripe-shaped coating films or narrow the width of the stripe-shaped coating films is eliminated.

Therefore, according to the present invention, it is possible to form an organic EL element on a large-sized substrate without increasing the pixel pitch or reducing the aperture ratio. As a result, it is possible to manufacture a large-sized organic EL display having a high resolution and high brightness.

BRIEF DESCRIPTION OF DRAWINGS

FIG. 11 is a cross-sectional view of the manufacturing device for an organic EL element according to Embodiment 1 of the present invention taken along the line 11-11 of FIG. 10, showing the flow of vapor deposition particles in a vapor deposition block.

FIG. 15 is a cross-sectional view of the manufacturing device for an organic EL element according to Embodiment 2 of the present invention taken along the line 15-15 of FIG. 14, showing the flow of vapor deposition particles in a vapor deposition block.

DESCRIPTION OF THE INVENTION

Figure 1:
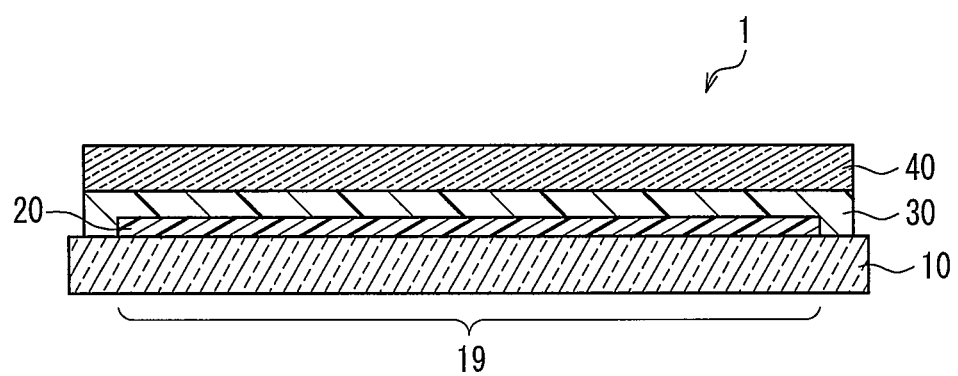
FIG. 1 is a cross-sectional view showing a schematic configuration of an organic EL display.

In the manufacturing method for an organic EL element of the present invention described above, it is preferable that the limiting plate prevents vapor deposition particles discharged from the vapor deposition source opening on one side of the limiting plate in the second direction from entering the mask opening disposed on the other side in the second direction. With this configuration, the traveling direction of the vapor deposition particles that pass through the mask openings can be more easily managed, and therefore the occurrence of a blur at both edges of a stripe-shaped coating film can be further suppressed.

It is preferable that the vapor deposition source opening is disposed between neighboring limiting plates in the second direction. This reduces the vapor deposition particles that adhere to the limiting plates, and it is thus possible to reduce the wasted vapor deposition material.

It is preferable that the number of the vapor deposition source opening is more than one. It is also preferable that the plurality of vapor deposition source openings and the plurality of limiting plates have substantially the same pitch in the second direction. With this configuration, it is possible to dispose a single vapor deposition source opening between a pair of neighboring limiting plates. Accordingly, the traveling direction of the vapor deposition particles that pass through the mask openings can be more easily managed, and thus the occurrence of a blur at both edges of a stripe-shaped coating film can be further suppressed. Also, a plurality of vapor deposition blocks, each including a pair of neighboring limiting plates, a single vapor deposition source opening disposed therebetween and mask openings, can be disposed in the second direction, and it is therefore possible to manufacture an organic EL element that is uniform over a wide range in the second direction.

It is preferable that a width in the second direction of each of the plurality of mask openings disposed between neighboring limiting plates in the second direction increases as the mask opening is located farther away in the second direction from a position in the second direction of the vapor deposition source opening disposed between the neighboring limiting plates in the second direction. With this configuration, a plurality of stripe-shaped coating films having the same width can be easily formed on the deposition surface of the substrate.

It is preferable that a length in the first direction of each of the plurality of mask openings disposed between neighboring limiting plates in the second direction increases as the mask opening is located farther away in the second direction from a position in the second direction of the vapor deposition source opening disposed between the neighboring limiting plates in the second direction. With this configuration, a plurality of stripe-shaped coating films having the same thickness can be easily formed on the deposition surface of the substrate.

It is preferable that a pitch in the second direction of the plurality of mask openings disposed between neighboring limiting plates in the second direction is constant. With this configuration, a plurality of stripe-shaped coating films having a constant pitch in the second direction can be easily formed on the deposition surface of the substrate.

It is preferable that a pitch in the second direction of the plurality of mask openings disposed between neighboring limiting plates in the second direction is smaller than a pitch in the second direction of the coating film formed on the substrate. With this configuration, a plurality of stripe-shaped coating films having a constant pitch in the second direction can be easily formed on the deposition surface of the substrate.

A plurality of the vapor deposition source openings may be arranged in a plurality of columns whose positions in the first direction are different. In this case, it is preferable that the plurality of mask openings and the plurality of limiting plates are disposed in the plurality of columns so as to correspond to positions of the plurality of vapor deposition source openings. This configuration increases flexibility in the design of the plurality of vapor deposition source openings, the plurality of limiting plates and the plurality of mask openings.

In the above-described case, it is preferable that at least one of the plurality of columns is different from at least another column, with respect to positions in the second direction of the vapor deposition source openings, the mask openings and the limiting plates. With this configuration, the distance between neighboring vapor deposition source openings in the second direction can be widened, and thus the design, production, maintenance, etc. of the limiting plates become easy. Also, the amount of vapor deposition material that adheres to the limiting plates can be reduced, as a result of which the wasted vapor deposition material can be reduced.

It is preferable that in two neighboring columns in the first direction out of the plurality of columns, the plurality of vapor deposition source openings are arranged in a staggered manner. With this configuration, a plurality of vapor deposition source openings can be efficiently disposed in the vapor deposition source. Furthermore, the distance between neighboring vapor deposition source openings in the second direction can be widened, and thus the design, production, maintenance, etc. of the limiting plates become easy. Also, the amount of vapor deposition material that adheres to the limiting plates can be reduced, as a result of which the wasted vapor deposition material can be reduced.

The vapor deposition unit may further include a second limiting plate between the vapor deposition source openings and the vapor deposition mask. In this case, it is preferable that the second limiting plate prevents vapor deposition particles discharged from the vapor deposition source openings on one side of the second limiting plate in the first direction from entering the mask openings disposed on the other side in the first direction. With this configuration, the traveling direction of the vapor deposition particles that pass through the mask openings can be more easily managed, and thus the occurrence of a blur at both edges of a stripe-shaped coating film can be further suppressed.

The vapor deposition source openings disposed respectively in two neighboring columns in the first direction may be open in directions opposite to each other with an inclination, as viewed in the second direction. With this configuration, it is possible to reduce the vapor deposition particles that are discharged from the vapor deposition source opening of one of two neighboring columns and enter the mask openings of the other column, and thus the occurrence of a blur at both edges of a stripe-shaped coating film can be further suppressed.

It is preferable that a pitch in the first direction of the vapor deposition source openings is not constant. For example, in the case where the direction in which the vapor deposition source openings discharge vapor deposition particles is changed for each column, by setting different pitches in the first direction of the vapor deposition source openings, it is possible to reduce the vapor deposition particles that are discharged from the vapor deposition source openings of one of two neighboring columns and enter the mask openings of the other column.

The vapor deposition particles that have passed through at least two mask openings belonging to at least two of the plurality of columns may form a common coating film on the substrate. This configuration increases flexibility in the design of the mask openings, the limiting plates, the vapor deposition source openings and the like.

The second limiting plate may be bent in a zigzag pattern. With this configuration, the arrangement density of vapor deposition source openings is increased, and thus the size of the vapor deposition unit can be reduced.

It is preferable that at least a part of the plurality of limiting plates is cooled. With this configuration, it is possible to prevent the vapor deposition particles that have adhered to the limiting plates from re-vaporization, and thus the occurrence of a blur at both edges of a stripe-shaped coating film can be further suppressed. As used herein, the expression "limiting plates are cooled" encompasses the case where the limiting plates are cooled directly and the case where the limiting plates are cooled indirectly by heat conduction or the like by cooling another member.

It is preferable that at least a part of the second limiting plate is cooled. With this configuration, it is possible to prevent the vapor deposition particles that have adhered to the second limiting plate from re-vaporization, and thus the occurrence of a blur at both edges of a stripe-shaped coating film can be further suppressed. As used herein, the expression "second limiting plate is cooled" encompasses the case where the second limiting plate is cooled directly and the case where the second limiting plate is cooled indirectly by heat conduction or the like by cooling another member.

It is preferable that the plurality of limiting plates are integrated together. With this configuration, the need to perform positioning of individual limiting plates is eliminated, and therefore the positional accuracy of the limiting plates is improved. Also, the task of replacing the plurality of limiting plates becomes easy. As used herein, the "plurality of limiting plates are integrated together" encompasses the case where a plurality of limiting plates are integrally created from a single material and the case where a plurality of limiting plates created separately are combined and integrated together.

It is preferable that the plurality of limiting plates and the second limiting plate are integrated together. With this configuration, the need to perform positioning of each of the plurality of limiting plates and the second limiting plate is eliminated. Also, the task of replacing the plurality of limiting plates and the second limiting plate becomes easy. As used herein, "a plurality of limiting plates and a plurality of second limiting plates are integrated together" encompasses the case where a plurality of limiting plates and a plurality of second limiting plates are integrally created from a single material and the case where a plurality of limiting plates and a plurality of second limiting plates created separately are combined and integrated together.

A thickness in the second direction of the limiting plates may be greater than an interval between neighboring limiting plates in the second direction. With this configuration, the surface of the limiting plates facing the vapor deposition source can be used as a shutter for blocking the vapor deposition particles.

A plurality of mask opening columns whose positions in the second direction are different may be disposed between neighboring limiting plates in the second direction. In this case, it is preferable that the plurality of mask opening columns each include a plurality of mask openings disposed in the first direction. With this configuration, reduction in the strength of the vapor deposition mask caused by forming a plurality of mask openings can be minimized. Also, the dimensional stability and heat conduction properties of the vapor deposition mask are improved.

In the above-described case, it is preferable that a total dimension in the first direction of the plurality of mask openings included in each of the plurality of mask opening columns increases as the mask opening column is located farther away in the second direction from a position in the second direction of the vapor deposition source opening disposed between neighboring limiting plates in the second direction. With this configuration, a plurality of stripe-shaped coating films having the same thickness can be easily formed on the deposition surface of the substrate.

The vapor deposition source opening may be a slit-shaped opening extending in the first direction. With this configuration, the area of the vapor deposition source opening is widened, and the amount of discharged vapor deposition particles is increased, and therefore the deposition rate is increased and throughput for mass production can be improved.

The vapor deposition source opening may be provided so as to extend across the limiting plates in the second direction. With this configuration, the area of the vapor deposition source opening is widened, and the amount of discharged vapor deposition particles is increased, and therefore the deposition rate is increased and throughput for mass production can be improved. Also, the positional accuracy in the second direction of the vapor deposition source with respect to the plurality of limiting plates and the vapor deposition mask can be relaxed.

In this case, it is preferable that a length in the first direction of the plurality of mask openings disposed between neighboring limiting plates in the second direction increases as a distance in the second direction to the limiting plate becomes shorter. With this configuration, a plurality of stripe-shaped coating films having the same thickness can be easily formed on the deposition surface of the substrate.

It is preferable that the coating film is a light emitting layer. It is thereby possible to manufacture a large-sized organic EL display having a high resolution and high brightness.

Hereinafter, the present invention will be described in detail by showing preferred embodiments. It should be noted, however, that the present invention is not limited to the following embodiments. For the sake of convenience of the description, the drawings referred to hereinafter show only the principal members required to describe the present invention in simplified form among the constituent members of the embodiments of the present invention. Accordingly, the present invention may include arbitrary constituent members that are not shown in the following drawings. Also, the dimensions of the members in the drawings do not faithfully represent the actual dimensions or dimensional proportions of the constituent members.

(Configuration of Organic EL Display)

An example of an organic EL display that can be manufactured by applying the present invention will be described. This organic EL display is a bottom emission type organic EL display in which light is extracted from the TFT substrate side and that displays full color images by controlling light emission of red (R), green (G) and blue (B) pixels (sub-pixels).

First, the overall configuration of the organic EL display will be described below.

Figure 2:
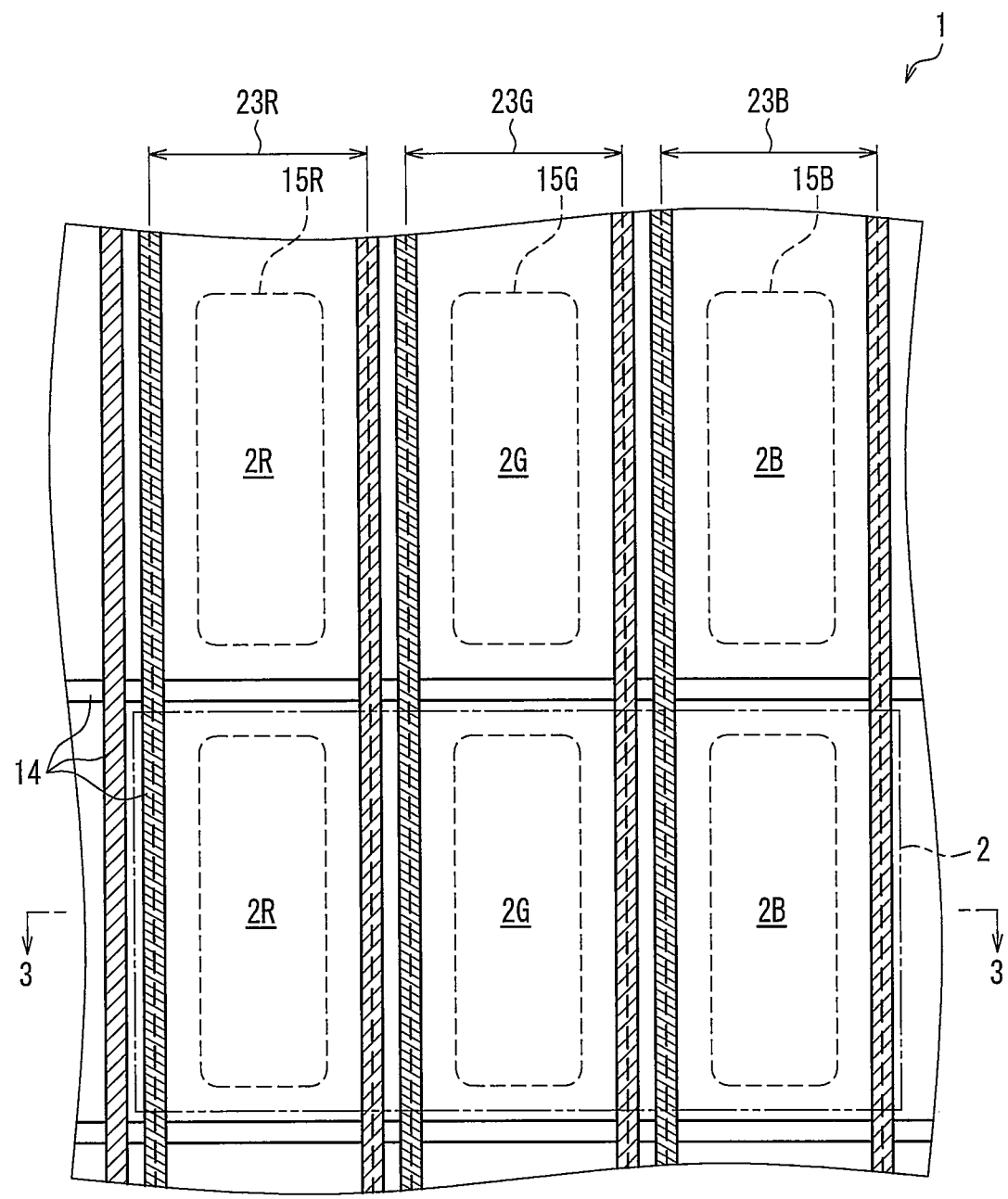
FIG. 2 is a plan view showing a configuration of pixels that constitute the organic EL display shown in FIG. 1.
Figure 3:
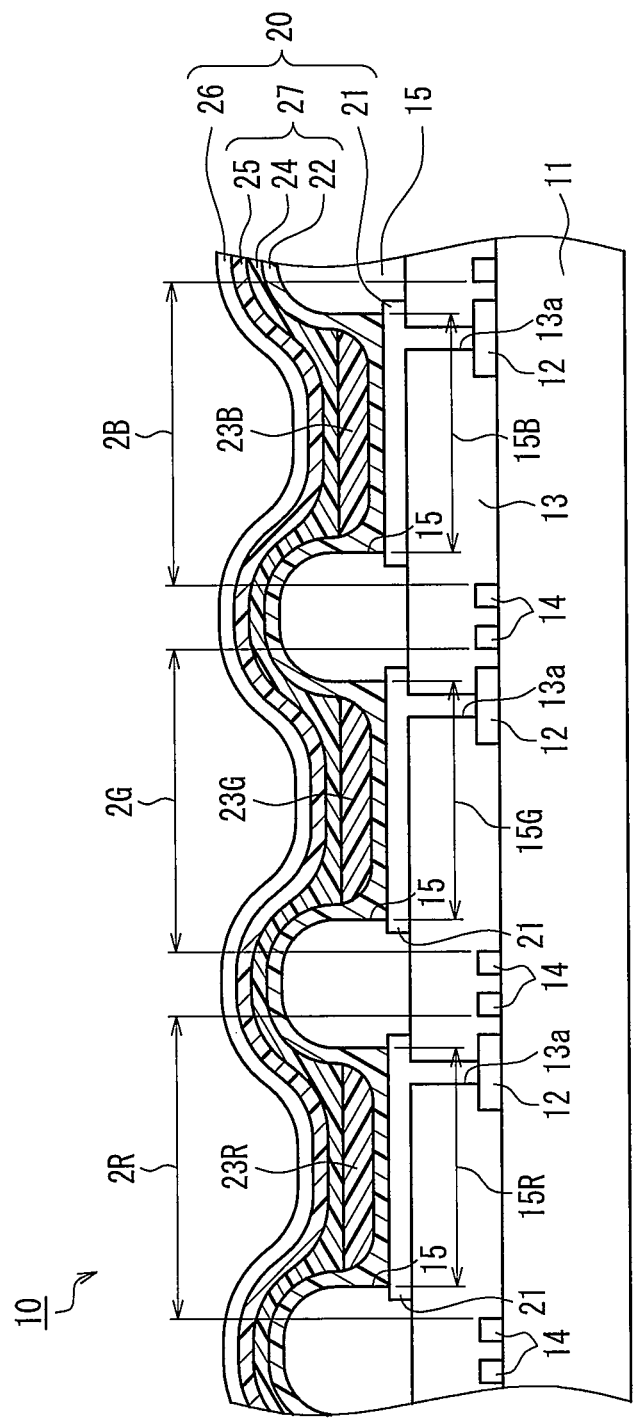
FIG. 3 is a cross-sectional view of a TFT substrate that constitutes the organic EL display taken along the line 3-3 of FIG. 2.

FIG. 1 is a cross-sectional view showing a schematic configuration of the organic EL display. FIG. 2 is a plan view showing a configuration of pixels that constitute the organic EL display shown in FIG. 1. FIG. 3 is a cross-sectional view of a TFT substrate that constitutes the organic EL display, taken along the line 3-3 of FIG. 2.

As shown in FIG. 1, the organic EL display 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the perpendicular direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13.

The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the light emitting layers 23R, 23G and 23B. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the light emitting layers 23R, 23G and 23B.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

The organic EL element 20 can take, for example, the following layer configurations as shown in (1) to (8) below.
(1) First electrode/light emitting layer/second electrode
(2) First electrode/hole transport layer/light emitting layer/electron transport layer/second electrode
(3) First electrode/hole transport layer/light emitting layer/hole blocking layer/electron transport layer/second electrode
(4) First electrode/hole transport layer/light emitting layer/hole blocking layer/electron transport layer/electron injection layer/second electrode
(5) First electrode/hole injection layer/hole transport layer/light emitting layer/electron transport layer/electron injection layer/second electrode
(6) First electrode/hole injection layer/hole transport layer/light emitting layer/hole blocking layer/electron transport layer/second electrode
(7) First electrode/hole injection layer/hole transport layer/light emitting layer/hole blocking layer/electron transport layer/electron injection layer/second electrode
(8) First electrode/hole injection layer/hole transport layer/electron blocking layer (carrier blocking layer)/light emitting layer/hole blocking layer/electron transport layer/electron injection layer/second electrode In the layer configurations listed above, for example, the hole injection layer and the hole transport layer may be integrated into a single layer. Likewise, the electron transport layer and the electron injection layer may be integrated into a single layer.

The configuration of the organic EL element 20 is not limited to the layer configurations (1) to (8) listed above, and it is possible to use, for example, any desired layer configuration according to the characteristics required of the organic EL element 20.

(Manufacturing Method for Organic EL Display)

A method for manufacturing an organic EL display 1 will be described below.

Figure 4:
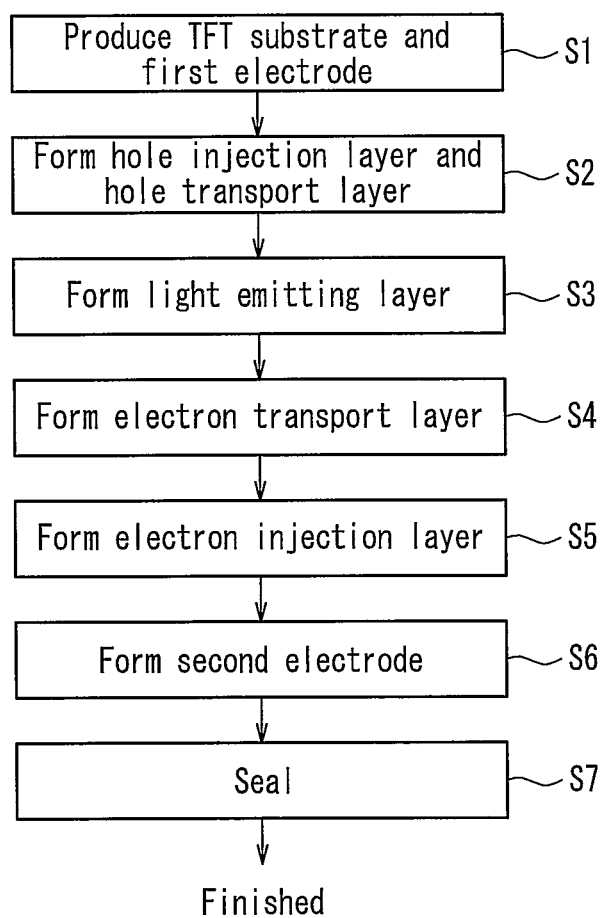
FIG. 4 is a flowchart illustrating the steps of a process for manufacturing an organic EL display in order.

FIG. 4 is a flowchart illustrating the steps of a process for manufacturing the above-described organic EL display 1 in order.

As shown in FIG. 4, the method for manufacturing an organic EL display 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. The insulating substrate 11 can have, although not limited to, a thickness of, for example, 0.7 to 1.1 mm and longitudinal and transverse dimensions of, for example, 500 mm×400 mm. As an example, a rectangular glass plate having a thickness of about 1 mm and longitudinal and transverse dimensions of 500×400 mm can be used.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Examples of acrylic resin include OPTMER series available from JSR Corporation. Examples of polyimide resin include Photoneece series available from Toray Industries, Inc. Generally, polyimide resin is not transparent but colored. For this reason, when manufacturing a bottom emission type organic EL display 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 μm can be formed by using acrylic resin.

Next, contact holes 13a for electrically connecting the first electrode 21 to the inter-layer film 13 are formed.

Next, a first electrode 21 is formed on the inter-layer film 13. Specifically, as a conductive film (electrode film), for example, an ITO (indium tin oxide) film is formed so as to have a thickness of, for example, 100 nm, on the inter-layer film 13 by a sputtering method or the like. Next, a photoresist is applied onto the ITO film and patterning is performed by using a photolithography technique, after which the ITO film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials, other than ITO, that can be used for the first electrode 21 include transparent conductive materials such as IZO (indium zinc oxide) and gallium-added zinc oxide (GZO); and metal materials such as gold (Au), nickel (Ni) and platinum (Pt).

As the method for laminating conductive films, other than a sputtering method, it is possible to use a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the inter-layer film 13. As an example, an inter-layer film 13 having a thickness of about 1 μm can be formed using acrylic resin.

Through the above processing, the TFT substrate 10 and the first electrode 21 are produced (step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, polysilane-based compounds; vinylcarbazole-based compounds; heterocyclic conjugated monomers, oligomers or polymers such as thiophene-based compounds, aniline-based compounds; and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex; bis(benzoquinolinato) beryllium complex; tri(dibenzoylmethyl)phenanthroline europium complex; ditolyl vinyl biphenyl; and the like.

The light emitting layers 23R, 23G and 23B can have a thickness of, for example, 10 to 100 nm.

The manufacturing method and manufacturing device for an organic EL element according to the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof; LiF (lithium fluoride); and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display 1 is obtained.

In the organic EL display 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
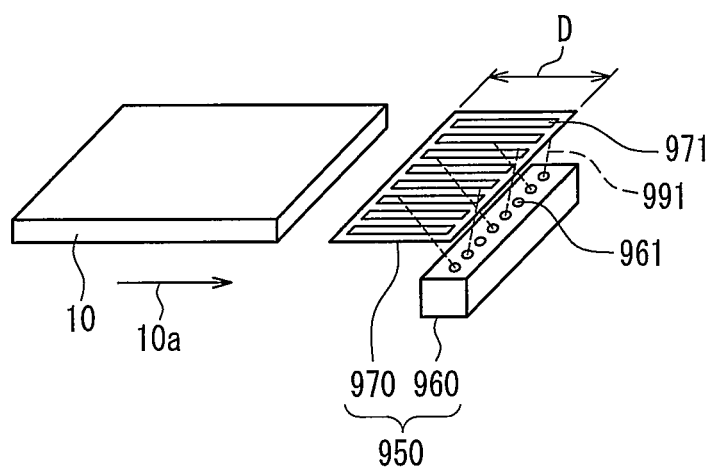
FIG. 5 is a perspective view showing the basic concept of a new vapor deposition method.

FIG. 5 is a perspective view showing the basic concept of the new vapor deposition method.

A vapor deposition source 960 and a vapor deposition mask 970 together constitute a vapor deposition unit 950. The relative position between the vapor deposition source 960 and the vapor deposition mask 970 is constant. A substrate 10 is moved at a constant speed in a direction indicated by 10a on the opposite side across the vapor deposition mask 970 from the vapor deposition source 960. A plurality of vapor deposition source openings 961 through which vapor deposition particles 991 are discharged are formed on the upper surface of the vapor deposition source 960. A plurality of mask openings 971 are formed in the vapor deposition mask 970. The vapor deposition particles 991 discharged from the vapor deposition source openings 961 pass through the mask openings 971 and adhere to the substrate 10. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension D of the vapor deposition mask 970 in the movement direction 10a of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

However, the present inventors found, as a result of a further investigation, the new vapor deposition method shown in FIG. 5 is problematic in that a blur is more likely to occur at the edges of the formed coating film (vapor deposition film) as compared to the vapor deposition methods of Patent Documents 1 and 2. The cause of this problem will be described below.

Figure 6:
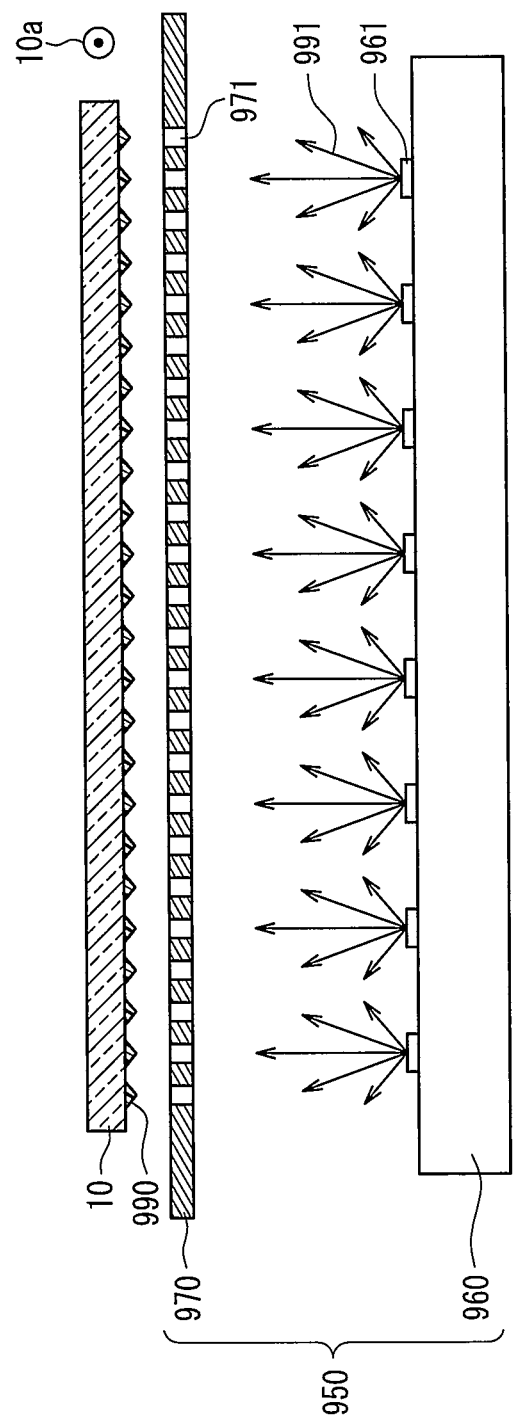
FIG. 6 is a front view of the vapor deposition device shown in FIG. 5 as viewed in a direction parallel to a traveling direction of the substrate.

FIG. 6 is a front view of the vapor deposition device shown in FIG. 5 as viewed in a direction parallel to the movement direction 10a of the substrate 10. A plurality of vapor deposition source openings 961 and a plurality of the mask opening 971 are arranged in the right-left direction of FIG. 6. The vapor deposition particles 991 from each vapor deposition source opening 961 are discharged over a certain range (directivity). Specifically, in FIG. 6, the number of vapor deposition particles 991 discharged from each vapor deposition source opening 961 is the greatest in a direction directly above the vapor deposition source opening 961 and gradually decreases as the angle (emission angle) formed with respect to the straight upward direction increases. The vapor deposition particles 991 discharged from the vapor deposition source openings 961 travel straight in their discharged direction. In FIG. 6, the flow of vapor deposition particles 991 discharged from the vapor deposition source openings 961 is conceptually indicated by arrows. Accordingly, each mask opening 971 mostly receives, but not necessarily limited thereto, the vapor deposition particles 991 discharged from the vapor deposition source opening 961 located directly below the mask opening 971 and also receives the vapor deposition particles 991 discharged from the vapor deposition source openings 961 located obliquely downward.

Figure 7:
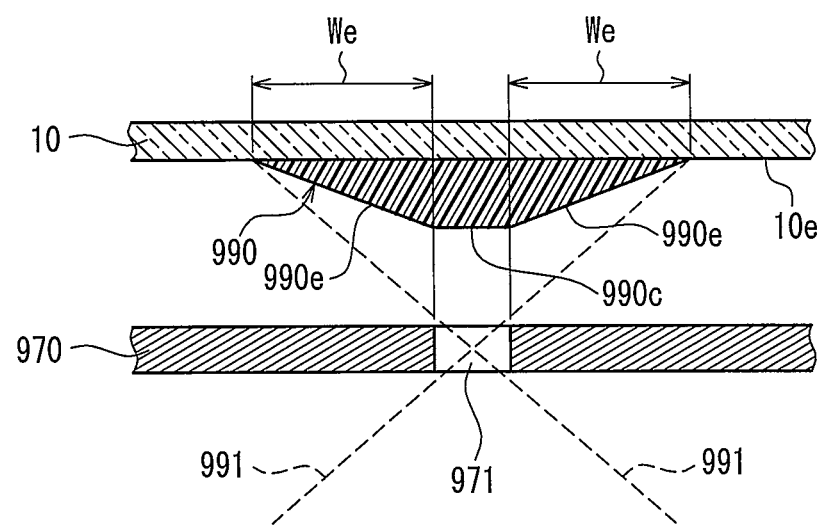
FIG. 7 is a cross-sectional view illustrating the cause of a blur generated at the edges of a coating film in the new vapor deposition method shown in FIG. 5.

FIG. 7 is a cross-sectional view of a coating film 990 formed on a substrate 10 by vapor deposition particles 991 that have passed through a mask opening 971, as viewed in a direction parallel to the movement direction 10a of the substrate 10 as in FIG. 6. As described above, the vapor deposition particles 991 coming from various directions pass through the mask opening 971. The number of vapor deposition particles 991 that reach a deposition surface 10e of the substrate 10 is the greatest in a region directly above the mask opening 971 and gradually decreases as the position gets farther away therefrom. Accordingly, as shown in FIG. 7, on the deposition surface 10e of the substrate 10, a constant thickness portion 990c whose thickness is constant and the thickest is formed in a region directly above the mask opening 971, and a thickness tapered portion 990e that becomes gradually thinner as the position gets farther away from the constant thickness portion 990c is formed on both sides of the constant thickness portion 990c. The thickness tapered portion 990e causes a blur at the edge of the coating film 990.

In order to reduce a width We of the thickness tapered portion 990e, it is sufficient to reduce the interval between the vapor deposition mask 970 and the substrate 10. However, with the new vapor deposition method, the substrate 10 needs to be moved relative to the vapor deposition mask 970, and therefore it is not possible to set the interval between the vapor deposition mask 970 and the substrate 10 to zero.

If the width We of the thickness tapered portion 990e is large, "color mixing" can occur as a result of the material of a neighboring light emitting layer having a different color adhering to the light emitting layer. In order to prevent color mixing from occurring, if the interval between neighboring light emitting layers is increased, the resolution will decrease. If, on the other hand, the width of each light emitting layer is reduced, the aperture ratio will decrease and brightness will be reduced.

The present inventors conducted an in-depth investigation to solve the problem encountered with the new vapor deposition method, and the present invention has been accomplished. Hereinafter, preferred embodiments of the present invention will be described.

Embodiment 1

Figure 8:
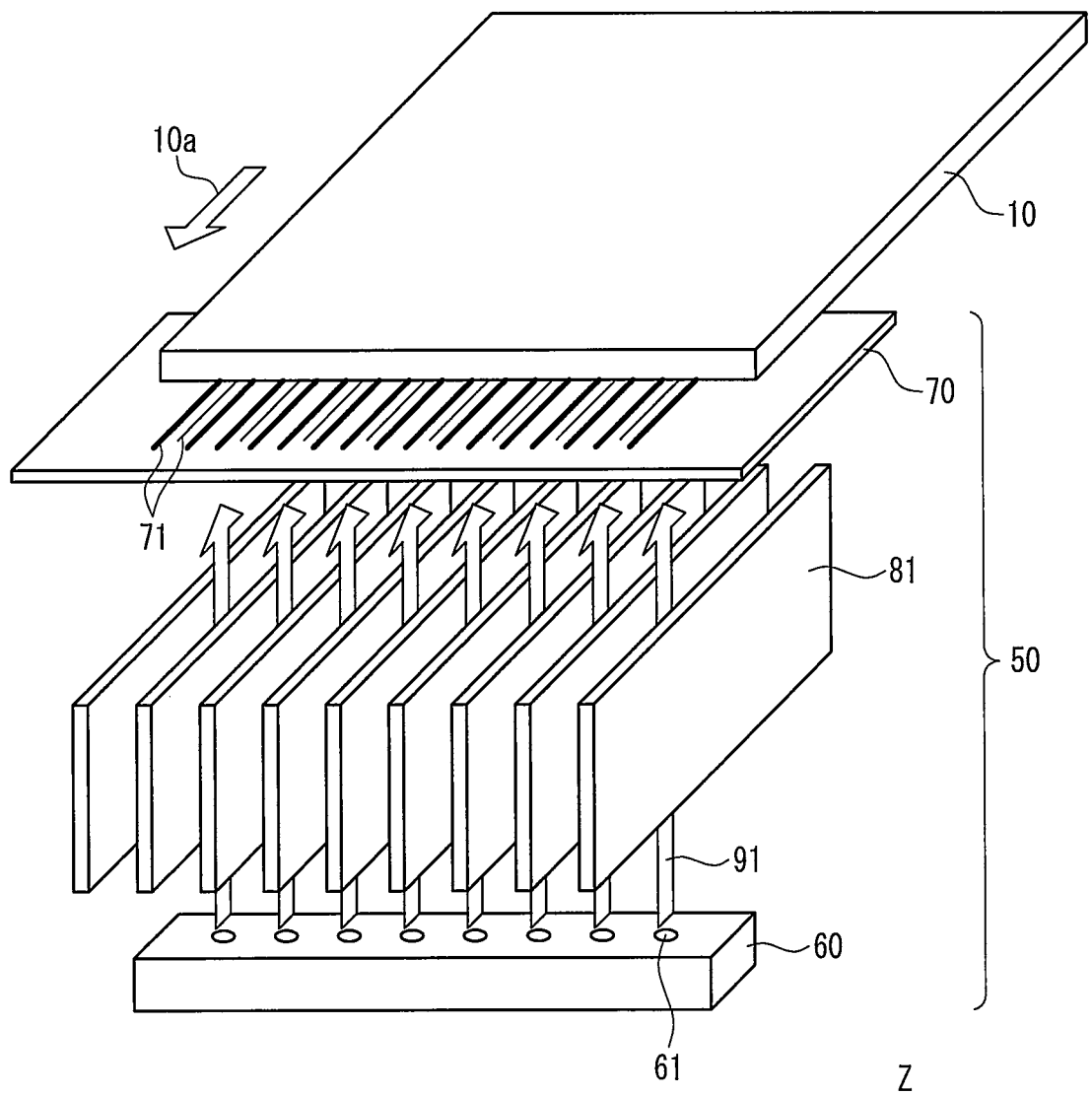
FIG. 8 is a perspective view showing a schematic configuration of a manufacturing device for an organic EL element according to Embodiment 1 of the present invention.
Figure 9:
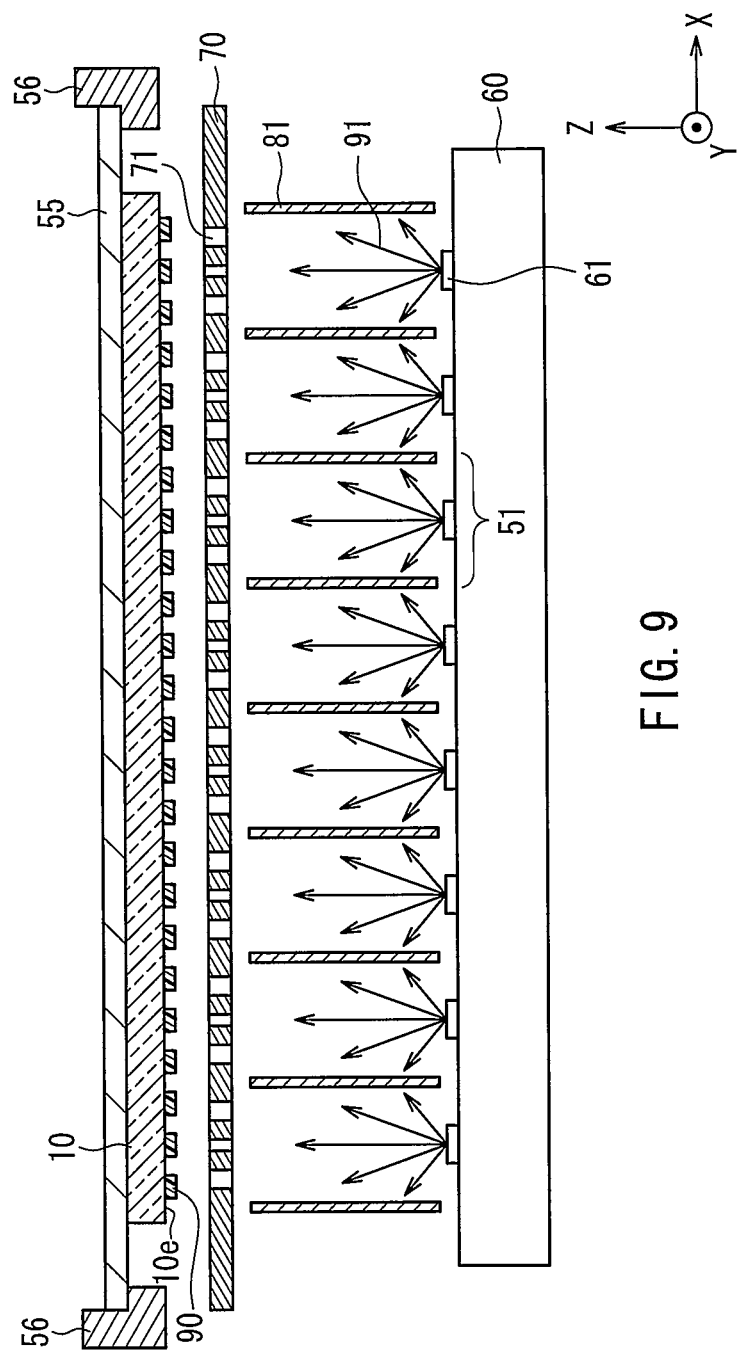
FIG. 9 is a front view of the manufacturing device for an organic EL element according to Embodiment 1 of the present invention, as viewed in a direction perpendicular to the width direction of a substrate.

FIG. 8 is a perspective view showing a schematic configuration of a manufacturing device for an organic EL element according to Embodiment 1 of the present invention. FIG. 9 is a front view of the manufacturing device for an organic EL element of Embodiment 1, as viewed in a direction perpendicular to a width direction (second direction) of a substrate 10. For the sake of convenience of the description given below, an XYZ orthogonal coordinate system is set in which a horizontal axis extending along the width direction of the substrate 10 is defined as the X axis, a horizontal axis perpendicular to the X axis is defined as the Y axis, and an up-down direction axis perpendicular to the X axis and the Y axis is defined as the Z axis. An XY plane is parallel to the deposition surface 10e of the substrate 10.

A vapor deposition mask 70 is disposed so as to oppose a vapor deposition source 60 in the Z axis direction. A plurality of limiting plates 81 are disposed between the vapor deposition source 60 and the vapor deposition mask 70. The relative position between the vapor deposition source 60, the vapor deposition mask 70 and the limiting plates 81 is constant at least during execution of vapor deposition by color, and these elements constitute a vapor deposition unit 50. The plurality of limiting plates 81 may be held by a jig (not shown) or may be integrated (see, for example, FIG. 21 described later) such that the relative position and orientation of the limiting plates 81 are maintained constant.

The substrate 10 is held by a holding device 55. As the holding device 55, for example, an electrostatic chuck that holds the surface of the substrate 10 opposite to the deposition surface 10e with electrostatic force can be used. The substrate 10 can thereby be held substantially without the substrate 10 being bent by its own weight. However, the holding device 55 for holding the substrate 10 is not limited to an electrostatic chuck and may be any other device.

The substrate 10 held by the holding device 55 is moved (scanned) in a direction (first direction) 10a at a constant speed by a moving mechanism 56 on the opposite side across the vapor deposition mask 70 from the vapor deposition source 60 in a state in which the substrate 10 is spaced apart from the vapor deposition mask 70 at a fixed interval. In Embodiment 1, the movement direction of the substrate 10 matches the positive direction of the Y axis. The movement of the substrate 10 may be a reciprocal movement or a single direction movement in which the substrate 10 is moved in either direction. There is no particular limitation on the configuration of the moving mechanism 56. For example, any known transfer driving mechanism can be used such as a linear motor or a feed screw mechanism that rotates a feed screw by a motor.

The vapor deposition unit 50, the substrate 10, the holding device 55 for holding the substrate 10 and the moving mechanism 56 for moving the substrate 10 are housed in a vacuum chamber (not shown). The vacuum chamber is a hermetically sealed container, with its internal space being vacuumed to a predetermined low pressure state and maintained.

In the present embodiment, the vapor deposition source 60 and the plurality of limiting plates 81 are spaced apart from each other. Also, the plurality of limiting plates 81 and the vapor deposition mask 70 are spaced apart from each other. This is done to dissipate heat and to maintain the degree of vacuum of the spaces between neighboring limiting plates 81 at a predetermined level. As long as no problem arises in these respects, the vapor deposition source 60 and the plurality of limiting plates 81 may be in contact with each other or integrated together, and/or the plurality of limiting plates 81 and the vapor deposition mask 70 may be in contact with each other or integrated together.

The vapor deposition source 60 includes, in its upper surface (specifically, the surface that opposes the vapor deposition mask 70), a plurality of vapor deposition source openings 61. The plurality of vapor deposition source openings 61 are arranged at an equal interval along the X axis. Each vapor deposition source opening 61 is upwardly open along the Z axis and discharges vapor deposition particles 91, which are a light emitting layer-forming material, toward the vapor deposition mask 70.

In the vapor deposition mask 70, a plurality of mask openings 71 are formed at different positions in the X axis direction. The plurality of mask openings 71 are arranged along the X axis direction. The vapor deposition particles 91 discharged from the vapor deposition source openings 61 pass through the mask openings 71 and adhere to a deposition surface (specifically, the surface of the substrate 10 facing the vapor deposition mask 70) 10e of the substrate 10, and a coating film 90 is thereby formed.

The plurality of limiting plates 81 are disposed along the X axis direction at different positions in the X axis direction. The plurality of limiting plates 81 are thin plates having the same dimensions. Each limiting plate 81 is perpendicular to the deposition surface 10e of the substrate 10 and parallel to the Y axis direction.

Figure 10:
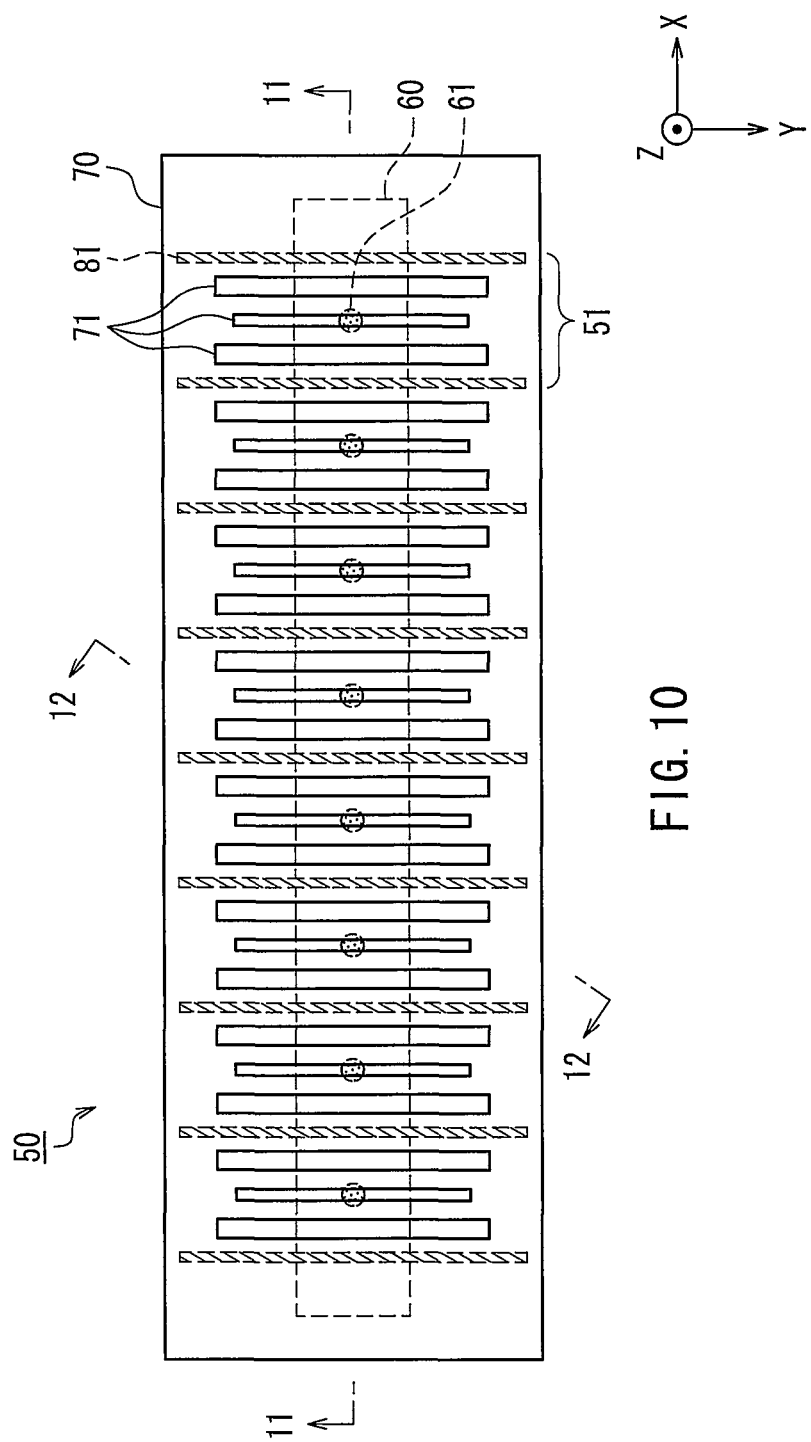
FIG. 10 is a see-through plan view of a vapor deposition unit that constitutes a manufacturing device for an organic EL element according to Embodiment 1 of the present invention, as viewed from the side where a vapor deposition mask is disposed.

FIG. 10 is a plan view of the vapor deposition unit 50, as viewed along the Z axis from the side where the vapor deposition mask 70 is disposed. FIG. 10 is shown as a see-through view so that the relative relationship between the vapor deposition source 60, the plurality of limiting plates 81 and the vapor deposition mask 70 can be seen.

As shown in FIG. 10, the plurality of limiting plates 81 are disposed in the X axis direction at the same pitch as that of the plurality of vapor deposition source openings 61. When viewed in a direction parallel to the Z axis, a single vapor deposition source opening 61 is disposed between each pair of neighboring limiting plates 81 in the X axis direction. The position of each vapor deposition source opening 61 in the X axis direction matches the center position of the pair of limiting plates 81 sandwiching the vapor deposition source opening 61 in the X axis direction. When viewed in a direction parallel to the Z axis, a plurality of mask openings 71 are arranged between each pair of neighboring limiting plates 81 in the X axis direction. Each mask opening 71 is a slit-shaped opening with its longitudinal direction matching the Y axis direction. The position of each mask opening 71 in the Y axis direction matches the position of the vapor deposition source opening 61 in the Y axis direction. A pair of neighboring limiting plates 81 in the X axis direction, a single vapor deposition source opening 61 arranged between the pair of limiting plates 81, and a plurality of mask openings 71 arranged between the pair of limiting plates 81 together constitute a single vapor deposition block 51. The vapor deposition unit 50 of the present invention includes a plurality of vapor deposition blocks 51 disposed along the X axis direction. The plurality of vapor deposition blocks 51 have the same configuration.

By using the manufacturing device for an organic EL element of the present embodiment configured as described above, light emitting layers 23R, 23G and 23B are formed as follows.

Vapor deposition particles 91 are discharged from the plurality of vapor deposition source openings 61 of the vapor deposition source 60, and in that state, the substrate 10 is moved in the Y axis direction. In each vapor deposition block 51, the vapor deposition particles 91 discharged from the vapor deposition source opening 61 pass between the pair of neighboring limiting plates 81 in the X axis direction, further pass through the plurality of mask openings 71 formed in the vapor deposition mask 70, and reach the deposition surface 10e of the substrate 10. As a result, the vapor deposition particles 91 adhere to the deposition surface 10e of the substrate 10, whereby a plurality of stripe-shaped coating films 90 are formed in the Y axis direction. The position in the X axis direction and width (dimension in the X axis direction) of the plurality of coating films 90 are determined by the relative positional relationship between the vapor deposition source openings 61, the mask openings 71 and the deposition surface 10e of the substrate 10, the width (dimension in the X axis direction) of the mask openings 71, and the like. The thickness of the coating films 90 is determined by the amount of vapor deposition particles discharged from the vapor deposition source openings 61, the length (dimension in the Y axis direction) of the mask openings 71, the relative speed of the substrate 10 with respect to the vapor deposition unit 50, and the like.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

The effects produced by the manufacturing device for an organic EL element of the present embodiment will be described.

With the new vapor deposition method shown in FIGS. 5 and 6, the vapor deposition particles 991 obliquely discharged from a vapor deposition source opening 961 pass through the mask openings 971 located distant from the vapor deposition source opening 961 and reach the substrate 10. In other words, the vapor deposition particles 991 coming from a plurality of vapor deposition source openings 961 pass through the mask opening 971. As a result, thickness tapered portions 990e as shown in FIG. 7 are formed, which cause a blur at the edges of the coating film 990.

In the present embodiment as well, as in the new vapor deposition method, the vapor deposition particles 91 are discharged over a certain range (directivity) from the vapor deposition source openings 61. In FIG. 9, the flow of vapor deposition particles 91 discharged from the vapor deposition source openings 61 is conceptually indicated by arrows. In the present embodiment, however, a plurality of limiting plates 81 are disposed between the vapor deposition source 60 and the vapor deposition mask 70. Accordingly, as shown in FIG. 9, among the vapor deposition particles 91 discharged from the vapor deposition source openings 61, those having a large speed vector component in the X axis direction collide with and adhere to the limiting plates 81, and thus cannot reach the mask openings 71. In other words, the limiting plates 81 limit the incidence angle of the vapor deposition particles 91 that enter the mask openings 71 on a projection onto the XZ plane. As used herein, the "incidence angle" is defined as the angle formed between the traveling direction of vapor deposition particles 91 and the Z axis on a projection onto the XZ plane. Thus, in the present embodiment, the vapor deposition particles 91 that pass through the mask openings 71 at a large incidence angle are reduced. Accordingly, the width We of the thickness tapered portions 990e shown in FIG. 7 is reduced. Preferably, the occurrence of the thickness tapered portions 990e is substantially eliminated. Therefore, the occurrence of a blur at both edges of the stripe-shaped coating film 90 is suppressed significantly. Also, the amount of positional offset in the X axis direction of the coating film 90 with respect to the mask openings 71 can be minimized.

By using thin plates as the limiting plates 81, the interval between the neighboring limiting plates 81 in the X axis direction can be increased. This increases the area of the gap between the limiting plates 81, and thus the amount of vapor deposition particles that adhere to the limiting plates 81 can be reduced. As a result, the wasted vapor deposition material can be reduced. Also, this makes clogging caused by the vapor deposition material adhering to the limiting plates 81 unlikely to occur, enabling long-time continuous use and improving the mass productivity of the organic EL element. Furthermore, because the area of the gap between the limiting plates 81 is large, it is easy to wash away the vapor deposition material adhering to the limiting plates 81, enabling simple maintenance and reducing the losses due to production stop, as a result of which mass productivity can be further improved.

The plurality of limiting plates 81 have a simple structure and do not require micron-order fine processing, which achieves easy production and a low cost.

As in the present embodiment, by disposing a plurality of vapor deposition blocks 51, each configured such that a pair of limiting plates 81 and a plurality of mask openings 71 are arranged with respect to each vapor deposition source opening 61, a design that provides high accuracy and a high design margin is possible. Also, on the deposition surface 10e of the substrate 10, uniform coating films 90 can be formed over a wide range.

Figure 12:
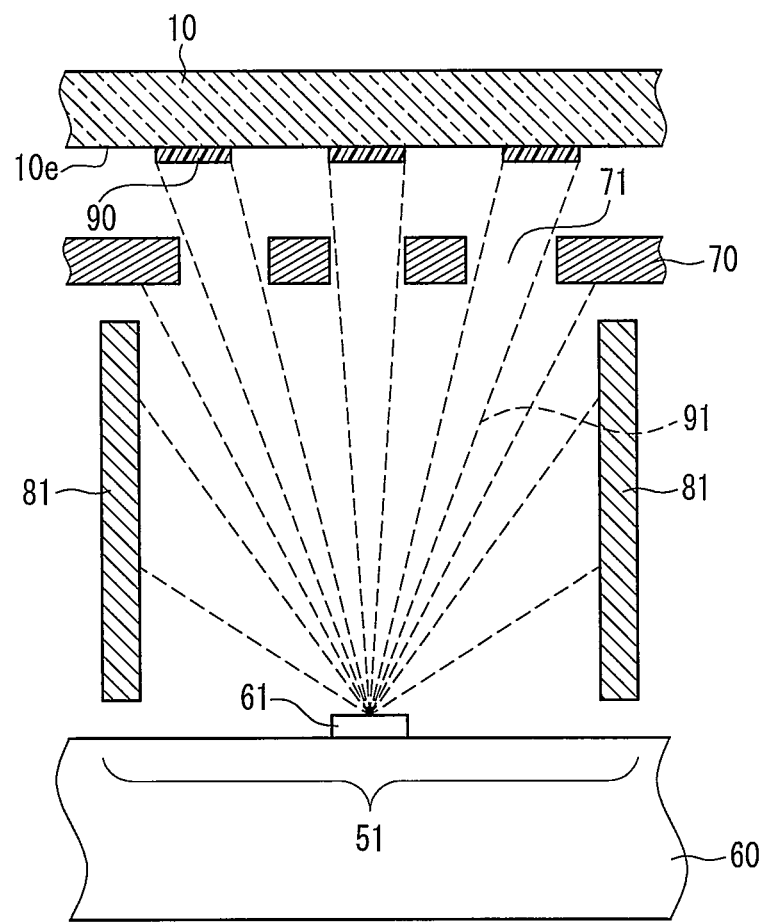
FIG. 12 is a cross-sectional view of the manufacturing device for an organic EL element according to Embodiment 1 of the present invention taken along the line 12-12 of FIG. 10, showing the flow of vapor deposition particles in a vapor deposition block.

FIG. 11 is a cross-sectional view showing the flow of vapor deposition particles 91 in a vapor deposition block 51 on a plane (the plane including the line 11-11 in FIG. 10) parallel to the XZ plane passing through vapor deposition source openings 61. FIG. 12 is a cross-sectional view showing the flow of vapor deposition particles 91 in a vapor deposition block 51 on a plane (the plane including the line 12-12 in FIG. 10) angled at 45 degrees to the XZ plane passing through vapor deposition source openings 61.

Preferably, as shown in FIGS. 11 and 12, the limiting plates 81 prevent the vapor deposition particles 91 discharged from a vapor deposition source opening 61 located on one side of a limiting plate 81 in the X axis direction from entering the mask openings 71 located on the other side. Accordingly, only the vapor deposition particles 91 coming from the vapor deposition source opening 61 belonging to a vapor deposition block 51 enter the mask openings 71 belonging to the vapor deposition block 51, and for example, the vapor deposition particles 91 coming from the vapor deposition source opening 61 belonging to a neighboring vapor deposition block 51 located adjacent in the X axis direction do not enter the mask openings 71.

Therefore, with respect to the mask openings 71 located directly above vapor deposition source openings 61, vapor deposition particles 91 enter substantially parallel to the Z axis. As a result, on the deposition surface 10e of the substrate 10, stripe-shaped coating films 90 having substantially the same width as the width of the mask openings 71 are formed at positions substantially above the mask openings 71. The coating films 90 are formed by only the vapor deposition particles 91 coming from the vapor deposition source openings 61 located directly below, and thus almost no blur occurs at both edges of the coating films 90.

On the other hand, with respect to mask openings 71 located obliquely above vapor deposition source openings 61, vapor deposition particles 91 enter at a relatively large incidence angle. Accordingly, on the deposition surface 10e of the substrate 10, coating films 90 are formed at positions slightly away from the straight upward direction of the mask openings 71 toward the outside (the side away from a straight line that passes through a vapor deposition source opening 61 and is parallel to the Z axis toward the X axis direction).

With the new vapor deposition method shown in FIG. 6, the vapor deposition particles 91 coming from a plurality of vapor deposition source openings 961 pass through a single mask opening 971, and therefore on the deposition surface of the substrate 10, a plurality of coating films corresponding one-to-one to the plurality of vapor deposition source openings 961 overlap at positions slightly displaced in the width direction, whereby a coating film 990 is formed. This causes formation of thickness tapered portions 990e on both sides of the coating films 990.

In contrast, with the present embodiment, the vapor deposition particles 91 that pass through the mask openings 71 are limited to those coming from the only one vapor deposition source opening 61 that belongs to a vapor deposition block 51 to which the mask opening 71 belongs. Accordingly, any coating film 90 formed on the deposition surface 10e of the substrate 10 is formed by only the vapor deposition particles 91 coming from a single vapor deposition source opening 61. Therefore, almost no blur occurs at both edges of stripe-shaped coating films 90 formed corresponding to the mask openings 71 located obliquely above the vapor deposition source opening 61. Also, the incidence angle of the vapor deposition particles 91 that enter the mask openings 71 is less than or equal to a predetermined upper limit value, and therefore the amount of positional offset in the X axis direction between the mask openings 71 and the corresponding coating films 90 is small.

Figure 13:
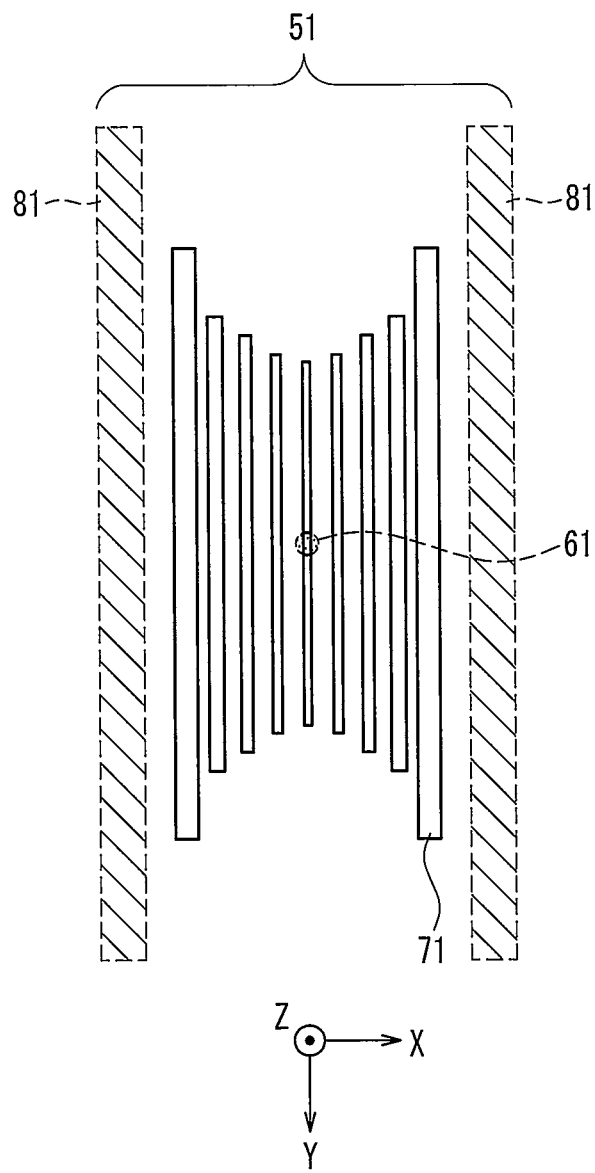
FIG. 13 is a see-through plan view of a vapor deposition block in the manufacturing device for an organic EL element according to Embodiment 1 of the present invention, as viewed from the side where a vapor deposition mask is disposed.

FIG. 13 is a plan view of a vapor deposition block 51, as viewed along the Z axis from the side where the vapor deposition mask 70 is disposed, and is shown as a see-through view showing only a vapor deposition source opening 61, a pair of limiting plates 81 and mask openings 71 that constitute the vapor deposition block 51. As shown in FIG. 10, a plurality of vapor deposition blocks 51 shown in FIG. 13 are disposed in the X axis direction. It should be noted that FIG. 10 is a simplified diagram, and thus the number of mask openings 71 does not match the number of mask openings 71 illustrated in FIG. 13. A preferred configuration of the mask openings 71 will be described with reference to FIG. 13.

As discussed in connection with FIG. 11, in the present embodiment, the position in the X axis direction of a coating film 90 formed by the vapor deposition particles 91 that have passed through the mask opening 71 located directly above a vapor deposition source opening 61 match the position in the X axis direction of the mask opening 71. On the other hand, the position in the X axis direction of a coating film formed by the vapor deposition particles 91 that have passed through a mask opening 71 located at a position displaced from the position in the X axis direction of the vapor deposition source opening 61 in the X axis direction is at a position displaced toward the side of the mask opening 71 that is opposite to the position in the X axis direction of the vapor deposition source opening 61. The amount of positional offset in the X axis direction between the mask opening 71 and the corresponding coating film 90 is proportional to the distance in the X direction between the mask opening 71 and the vapor deposition source opening 61.

Accordingly, in the present embodiment, the pitch in the X axis direction of a plurality of mask openings 71 that constitute a vapor deposition block 51 is set to be smaller than the pitch in the X axis direction of a plurality of stripe-shaped coating films 90 that are to be formed on the deposition surface 10e of the substrate 10. Furthermore, as shown in FIG. 13, the pitch in the X axis direction of a plurality of mask openings 71 that constitute a vapor deposition block 51 is constant. As used herein, the pitch in the X axis direction of the mask openings 71 and the coating films 90 is defined by an interval in the X axis direction between center axes parallel to the Y axis direction passing through the center positions of the mask openings 71 and the coating film 90 in the X axis direction. With this preferred configuration, on the deposition surface of the substrate 10, a plurality of stripe-shaped coating films 90 can be easily formed at an equal pitch in the X axis direction. The reason that the present embodiment enables easy formation of coating films 90 at an equal pitch is due to the fact that the vapor deposition source openings 61 that discharge the vapor deposition particles 91 that can pass through the mask openings 71 are limited by the limiting plates 81. With the configuration described above, the optimal pitch in the X axis direction of a plurality of mask openings 71 can be easily obtained by geometric calculations in consideration of the relative positional relationship between the vapor deposition source openings 61, the vapor deposition mask 70 and the substrate 10, the thickness of the vapor deposition mask 70, the shape of the inner circumferential surface of the mask openings 71 on an XZ cross section, the position in the X axis direction of a plurality of coating films 90 that are to be formed, and the like.

The vapor deposition mask 70 has a certain thickness. Accordingly, as can be seen from FIG. 11, the effective width Wx of mask openings 71 as viewed from the vapor deposition source openings 61 varies depending on the position in the X axis direction of the mask openings 71. To be more precise, the effective width Wx of the mask opening 71 located directly above the vapor deposition source opening 61 is substantially the same as the dimension in the X axis direction of the mask opening 71, but the effective width Wx of the mask opening 71 becomes smaller than the dimension in the X axis direction of the mask opening 71 as the mask opening 71 is located farther away from the position directly above the vapor deposition source opening 61 toward the X axis direction. As used herein, the "effective width Wx" of the mask opening 71 is defined as the width in the X axis direction of a flowing flux of the vapor deposition particles 91 that can pass through the mask opening 71 (vapor deposition particle flowing flux).

Thus, in the present embodiment, as shown in FIG. 13, the width (in other words, dimension in the X axis direction) of the mask opening 71 is set such that the mask opening 71 located directly above the vapor deposition source opening 61 has the smallest width, and the width of the mask opening 71 is increased as the position of the mask opening 71 is farther away from the position in the X axis direction of the vapor deposition source opening 61 toward the X axis direction (specifically, as the distance in the X axis direction between the mask opening 71 and the limiting plate 81 becomes smaller). The width of the mask opening 71 located directly above the vapor deposition source opening 61 is set so as to be substantially the same as that of the coating film 90 that is to be formed. With this configuration, the effective width Wx of all of the mask openings 71 that belong to a vapor deposition block 51 becomes the same, and thus a plurality of stripe-shaped coating films 90 having the same width can be easily formed on the deposition surface of the substrate 10. The reason that the present embodiment enables easy formation of the coating films 90 having the same width as described above is due to the fact that the vapor deposition source openings 61 that discharge the vapor deposition particles 91 that can pass through the mask openings 71 are limited by the limiting plates 81. With the configuration described above, the optimal width of each of a plurality of mask openings 71 can be easily obtained by geometric calculations in consideration of the relative positional relationship between the vapor deposition source opening 61, the mask openings 71 and the substrate 10, the thickness of the vapor deposition mask 70, the shape of the inner circumferential surface of the mask openings 71 on an XZ cross section, the position in the X axis direction of a plurality of coating films 90 that are to be formed, and the like.

As described above, the vapor deposition particles 91 are discharged over a certain range (directivity) from a vapor deposition source opening. Specifically, the number of the vapor deposition particles 91 discharged from the vapor deposition source opening 61 is the greatest in the opening direction of the vapor deposition source opening 61 (specifically, the direction parallel to the Z axis) and gradually decreases as the angle (emission angle) formed with respect to the opening direction increases. Accordingly, when viewed in a direction parallel to the Z axis such as in FIG. 13, the density of vapor deposition particles that pass through the mask opening 71 (the number of vapor deposition particles that pass through a unit area parallel to the XY plane) is reduced as the position of the mask opening 71 is farther away from the vapor deposition source opening 61 in the X axis direction.

Thus, in the present embodiment, as shown in FIG. 13, the length (in other words, dimension in the Y axis direction) of the mask opening 71 is set such that the mask opening 71 located directly above the vapor deposition source opening 61 has the shortest length, and the length of the mask opening 71 is increased as the position of the mask opening 71 is farther away from the position in the X axis direction of the vapor deposition source opening 61 toward the X axis direction (specifically, as the distance in the X axis direction between the mask opening 71 and the limiting plate 81 becomes smaller). The length of the mask opening 71 is proportional to the time during which the substrate 10 is exposed to the vapor deposition particles that have passed through the mask opening occurs when the substrate 10 is moved in the Y axis direction, and thus by changing the length of the mask openings 71 as described above, the number of vapor deposition particles that pass through the mask opening 71 is the same in all of the mask openings belonging to a vapor deposition block 51. Accordingly, a plurality of stripe-shaped coating films 90 having the same thickness can be easily formed on the deposition surface 10e of the substrate 10. The reason that the present embodiment enables easy formation of coating films having the same thickness is due to the fact that the vapor deposition source openings 61 that discharge the vapor deposition particles 91 that can pass through the mask openings 71 are limited by the limiting plates 81. With the configuration described above, the optimal length of each of a plurality of mask openings 71 can be easily obtained by geometric calculations in consideration of the relative positional relationship between the vapor deposition source opening 61, the mask openings 71 and the substrate 10, the thickness of the vapor deposition mask 70, the shape of the inner circumferential surface of the mask openings 71 on an XZ cross section, the position in the X axis direction of a plurality of coating films 90 that are to be formed, and the like.

The above embodiment is merely an example and can be modified as appropriate.

For example, in the above embodiment, the pitch of the vapor deposition source openings 61 in the X axis direction and the pitch of the limiting plates 81 in the X axis direction are the same, but the present invention is not limited thereto. For example, it is possible to set the pitch of the limiting plates 81 in the X axis direction to an integral multiple of the pitch of the vapor deposition source openings 61 in the X axis direction, and arrange a plurality of vapor deposition source openings 61 between a pair of neighboring limiting plates 81 in the X axis direction.

The shape of the limiting plates 81 as viewed in the X axis direction is not necessarily a rectangle and may be, for example, a substantial trapezoid whose vapor deposition source 60 side is small and whose vapor deposition mask 70 side is large. Also, the limiting plates 81 are not necessarily flat plates, and may be, for example, bent or curved or may be corrugated plates.

The thickness (dimension in the X axis direction) of the limiting plates 81 can be suitably set as long as the mask openings 71 are not substantially blocked and the coating films 90 can be formed at desired positions on the substrate 10. Also, the limiting plates 81 do not necessarily have a constant thickness and may have, for example, a tapered cross section whose vapor deposition source 60 side is thick and whose vapor deposition mask 70 side is thin.

There is no particular limitation on the dimension in the Z axis direction and the dimension in the Y axis direction of the plurality of limiting plates 81. The dimensions of the limiting plates 81 are preferably set such that a mask opening 71 that belongs to a neighboring vapor deposition block 51 cannot be seen from the vapor deposition source opening 61. Furthermore, it may be possible to extend the lower ends of the limiting plates 81 to the vapor deposition source 60 and/or to extend the upper limit of the limiting plates 81 to the vapor deposition mask 70. In this case, the vapor deposition particles entering from neighboring vapor deposition blocks 51 can be reduced significantly, and thus color mixing can be reduced significantly, as a result of which the design margin of the organic EL element such as placement of the light emitting layers is improved.

The limiting plates 81 may be cooled. It is thereby possible to prevent the vapor deposition particles that have adhered to the limiting plates 81 from re-vaporization, which makes management of the traveling direction and amount of the vapor deposition particles 91 passing through the mask openings 71 easy. As a result, high-quality coating films 90 can be formed. There is no particular limitation on the method for cooling the limiting plates 81, and for example, a water-cooling method can be used. A cooling device may be attached to the limiting plates 81 or to the jig that holds the limiting plates 81 so as to cool the limiting plates 81 by heat conduction.

There is no particular limitation on the method for creating the limiting plates 81. It is possible to, for example, separately create a plurality of limiting plates 81 and fix them to a jig or the like by welding or the like. Alternatively, by forming a plurality of linearly aligned through holes in a thick plate, the wall between each neighboring through holes may be used as the limiting plate 81, such as a limiting plate block 85 (see FIG. 21).

The pattern of mask openings 71 formed in the vapor deposition mask 70 is not limited to that of the above embodiment. The pattern of the mask openings 71 can be easily obtained by geometric calculations in consideration of the relative positional relationship between the vapor deposition source openings 61, the vapor deposition mask 70 and the substrate 10, the thickness of the vapor deposition mask 70, the shape of the inner circumferential surface of the mask openings 71 on an XZ cross section, the position in the X axis direction of a plurality of coating films 90 that are to be formed, and the like. Accordingly, the pattern of mask openings 71 can be freely changed and designed to any pattern besides that of the above embodiment.

In the above embodiment, the shape of the vapor deposition source opening 61 is a circular hole having a small diameter, but the present invention is not limited thereto, and may be a hole of any shape such as, for example, an ellipse, a rectangle or a slit-shape. The dimension of the opening can be suitably set. However, depending on the shape and dimension of the vapor deposition source openings 61, the diffusion (directivity) of the vapor deposition particles discharged from the vapor deposition source opening 61 varies, and the design of the limiting plates 81 and the mask openings 71 may need to be reconsidered.

The degree of diffusion (directivity) of the vapor deposition particles 91 discharged from the vapor deposition source opening 61 can be freely set. The limiting plates 81 and the mask openings 71 can be changed as appropriate according to the diffusion of the vapor deposition particles 91.

In the above embodiment, the vapor deposition blocks 51 are disposed so as to be linearly aligned in parallel to the X axis, but the present invention is not limited thereto. For example, the vapor deposition blocks 51 may be disposed in a staggered arrangement (see, for example, FIG. 14 described later), or may be disposed such that a plurality of columns, each composed of vapor deposition blocks 51 that are aligned along a straight line parallel to the X axis, are disposed in the Y axis direction (see, for example, FIGS. 14, 17, 19 and 20 described later).

In the above embodiment, the substrate 10 is moved relative to the vapor deposition unit 50 that does not move, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In the above embodiment, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

Embodiment 2

Embodiment 2 will be described, focusing on differences from Embodiment 1.

Figure 14:
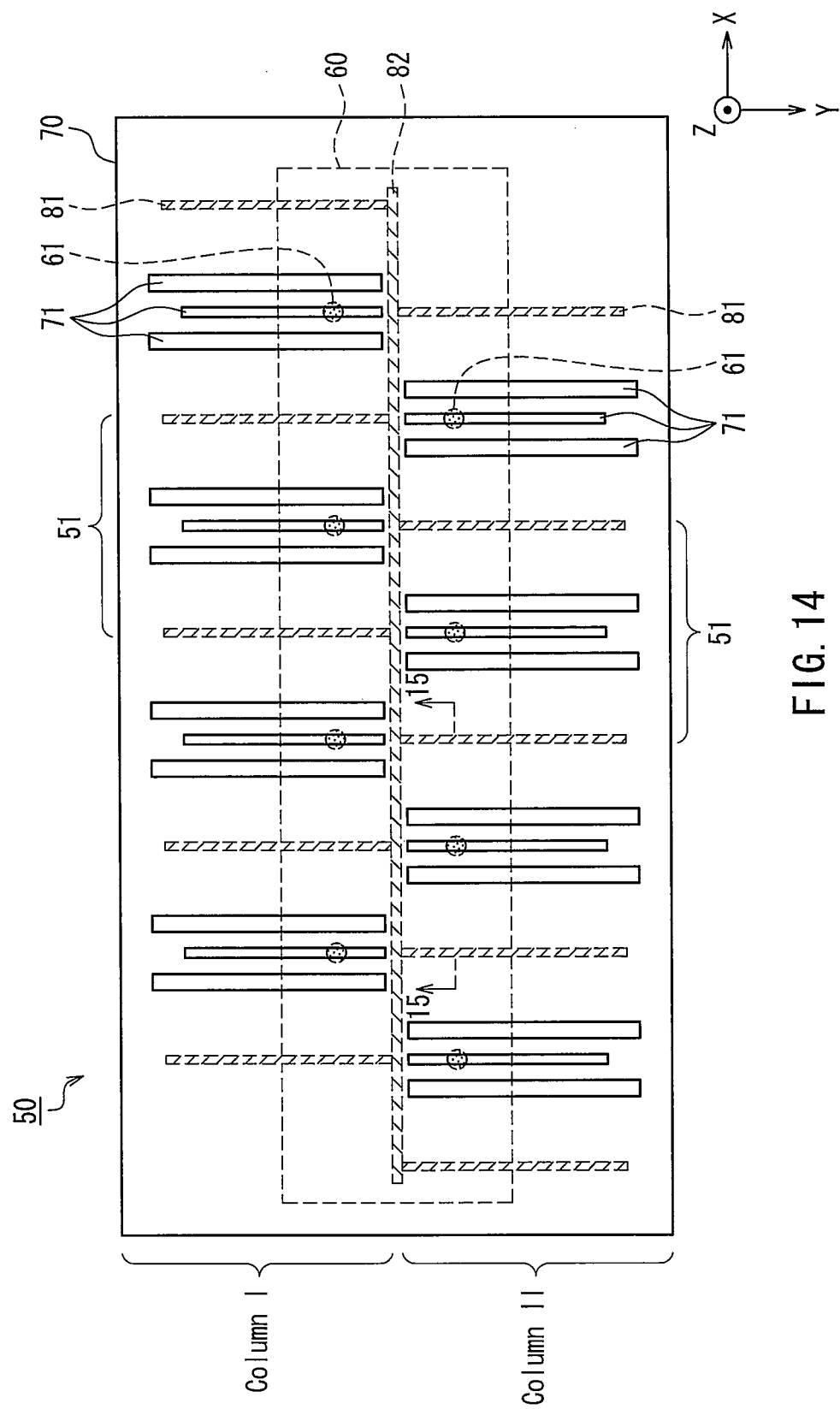
FIG. 14 is a see-through plan view of a vapor deposition unit that constitutes a manufacturing device for an organic EL element according to Embodiment 2 of the present invention, as viewed from the side where a vapor deposition mask is disposed.

FIG. 14 is a plan view of a vapor deposition unit 50 that constitutes a manufacturing device for an organic EL element according to Embodiment 2 of the present invention, as viewed from the side where a vapor deposition mask 70 is disposed along the Z axis. Similarly to FIG. 10, FIG. 14 is shown as a see-through view so that the relative relationship between a vapor deposition source 60, a plurality of limiting plates 81 and a vapor deposition mask 70 can be seen.

The present embodiment is different from Embodiment 1 in that a plurality of vapor deposition source openings 61 formed in the vapor deposition source 60 are staggered in two columns. Specifically, as shown in FIG. 14, a plurality of vapor deposition source openings 61 are arranged at an equal pitch in a direction parallel to the X axis in a column I located upstream in the movement direction of the substrate 10 relative to the vapor deposition unit 50, and a plurality of vapor deposition source openings 61 are arranged at an equal pitch in a direction parallel to the X axis in a column II located downstream in the movement direction of the substrate 10 relative to the vapor deposition unit 50. The pitch in the X axis direction of the vapor deposition source openings 61 is the same in the column I and the column II. It should be noted, however, that the vapor deposition source openings 61 of the column I and the vapor deposition source openings 61 of the column II are alternately arranged in the X axis direction.

In each of the column I and the column II, a plurality of limiting plates 81 are disposed at different positions in the X axis direction along the X axis direction so as to sandwich each vapor deposition source opening 61 in the X axis direction, as in Embodiment 1.

A second limiting plate 82 extending in the X axis direction is provided between the limiting plates 81 of the column I and the limiting plates 81 of the column II. The column II-side edges of the limiting plates 81 of the column I and the column I-side edges of the limiting plates 81 of the column II are connected to the second limiting plate 82. The upper edge the second limiting plate 82 in the Z axis direction protrudes above from the upper edges of the plurality of limiting plates 81 in the Z axis direction toward the vapor deposition mask 70, and the lower edge of the second limiting plate 82 in the Z axis direction protrudes below from the lower edges of the plurality of limiting plates 81 in the Z axis direction toward the vapor deposition source 60 (see FIG. 15 described later).

In the vapor deposition mask 70, a plurality of mask openings 71 are formed so as to correspond to respective vapor deposition source openings 61, as in Embodiment 1. The plurality of mask openings 71 are also arranged in two columns, namely, the column I and the column II parallel to the X axis. The position in the X axis direction of the mask openings 71 is different in the column I and the column II. Each mask opening 71 is a slit-shaped opening with its longitudinal direction matching the Y axis direction. The plurality of mask openings 71 formed in the vapor deposition mask 70 are in one-to-one correspondence with a plurality of stripe-shaped coating films 10 that are to be formed on the deposition surface of the substrate 10.

As in Embodiment 1, in the present embodiment as well, a pair of neighboring limiting plates 81 in the X axis direction, a single vapor deposition source opening 61 formed between the pair of limiting plates 81 and a plurality of mask openings 71 formed between the pair of limiting plates 81 together constitute a single vapor deposition block 51. In the present embodiment, a plurality of vapor deposition blocks 51 are arranged in a staggered manner.

FIG. 15 is a cross-sectional view showing the flow of vapor deposition particles 91 in a vapor deposition block 51 on a plane that passes through the vapor deposition source openings 61 and is parallel to the XZ plane (the plane including the line 15-15 in FIG. 14). In the present embodiment as well, as in Embodiment 1, on a projection onto the XZ plane, the limiting plates 81 limit the incidence angle of the vapor deposition particles 91 entering the mask openings 71. Preferably, the limiting plates 81 prevent the vapor deposition particles 91 discharged from a vapor deposition source opening 61 located on one side of the limiting plate 81 in the X axis direction from entering the mask openings 71 located on the other side. FIG. 15 shows the flow of vapor deposition particles 91 in the vapor deposition block 51 constituting the column II, and the flow of vapor deposition particles 91 in the vapor deposition block 51 constituting the column I is the same as that shown in FIG. 15.

Also, although not illustrated in the diagrams, the second limiting plate 82 prevents the vapor deposition particles discharged from the vapor deposition source openings 61 located on one side of the second limiting plate 82 in the Y axis direction from entering the mask openings 71 arranged on the other side in the Y axis direction. Preferably, the second limiting plate 82 prevents the vapor deposition particles from migrating between the vapor deposition blocks 51 of the column I and the vapor deposition blocks 51 of the column II. In the present embodiment, because a plurality of vapor deposition blocks 51 are arranged in a staggered manner, on a projection onto the XZ plane, the second limiting plate 82 limits the incidence angle of the vapor deposition particles that enter the mask openings 71, similarly to the limiting plates 81.

In the present embodiment as well, as in Embodiment 1, the substrate 10 is moved in the Y axis direction while the vapor deposition particles 91 are discharged from the plurality of vapor deposition source openings 61, so as to cause the vapor deposition particles 91 to adhere to the deposition surface 10e of the substrate 10, whereby a plurality of stripe-shaped coating films 90 parallel to the Y axis direction are formed.

According to the present embodiment, by providing the limiting plates 81 and the second limiting plate 82, the occurrence of a blur at both edges of a stripe-shaped coating film 90 formed on the deposition surface 10e of the substrate 10 can be suppressed, as in Embodiment 1.

Furthermore, the present embodiment produces the following effects.

In the present embodiment, because a plurality of vapor deposition blocks 51 are arranged in a staggered manner, the pitch in the X axis direction of the vapor deposition blocks 51 (or vapor deposition source openings 61) arranged in the X axis direction can be increased as compared to that of Embodiment 1. In other words, the distance in the X axis direction between a vapor deposition source opening 61 that belongs to one of two neighboring vapor deposition blocks 51 in the X axis direction and a mask opening 71 that belongs to the other vapor deposition block 51 can be increased as compared to that of Embodiment 1. Accordingly, the possibility that the vapor deposition particles 91 discharged from the vapor deposition source opening 61 arranged on one side of the limiting plate 81 in the X axis direction might go over the limiting plate 81 and enter the mask openings 71 arranged on the other side is lower than that of Embodiment 1. Therefore, flexibility in the design of the limiting plates 81 can be enhanced as compared to that of Embodiment 1. It is possible to, for example, reduce the dimension in the Z axis direction of the limiting plates 81, increase the interval between the neighboring limiting plates 81 in the X axis direction, or increase the thickness (dimension in the X axis direction) of the limiting plates 81, which makes the design, production and maintenance of the limiting plates 81 easy.

With respect to the design, in addition to the design of the limiting plates 81, the design of the peripheral structure thereof also becomes easy. For example, reducing the dimension in the Z axis direction of the limiting plates 81 makes it easy to dispose a shutter for switching between start and stop of vapor deposition between the limiting plates 81 and the vapor deposition source 60 or between the limiting plates 81 and the vapor deposition mask 70. Also, increasing the interval between the neighboring limiting plates 81 in the X axis direction or the thickness of the limiting plates 81 makes it easy to install a cooling device (for example, a cooling water pipe through which cooling water flows) for cooling the limiting plates 81 in the limiting plates 81.

With respect to the production, as compared to Embodiment 1, the interval between the neighboring limiting plates 81 can be increased and the required dimension accuracy can be reduced, and therefore the limiting plates 81 can be produced with ease and at a low cost.

With respect to the maintenance, because the area of the gap between the limiting plates 81 can be increased, clogging is unlikely to occur, enabling long-time continuous use and therefore improving the mass productivity of the organic EL element. Also, the vapor deposition material adhering to the limiting plates 81 can be easily washed away and removed, enabling simple maintenance and reducing the losses due to stop of mass production, as a result of which the mass productivity can be further improved.

Also, reducing the dimension in the Z axis direction of the limiting plates 81 or increasing the interval between the neighboring limiting plates 81 in the X axis direction enables the amount of vapor deposition material that adheres to the limiting plates 81 to be reduced, as a result of which the wasted vapor deposition material can be reduced.

Also, migration of the vapor deposition particles 91 between neighboring vapor deposition blocks 51 in the X axis direction is reduced as compared to Embodiment 1, and thus the occurrence of a blur at both edges of a stripe-shaped coating film 90 formed on the deposition surface 10e of the substrate 10 can be further suppressed, and the organic EL element can be created with higher accuracy.

Also, migration of the vapor deposition particles 91 between neighboring vapor deposition blocks 51 in the X axis direction is reduced as compared to Embodiment 1, it is therefore possible to reduce the pitch in the X axis direction of vapor deposition source openings 61 that can be formed in the vapor deposition source 60. Accordingly, the deposition rate can be improved, whereby throughput is improved. Also, the present embodiment can be easily adapted to forming thin films 90 at a fine pitch in the X axis direction, and therefore a high resolution organic EL display can be easily manufactured.

Figure 16:
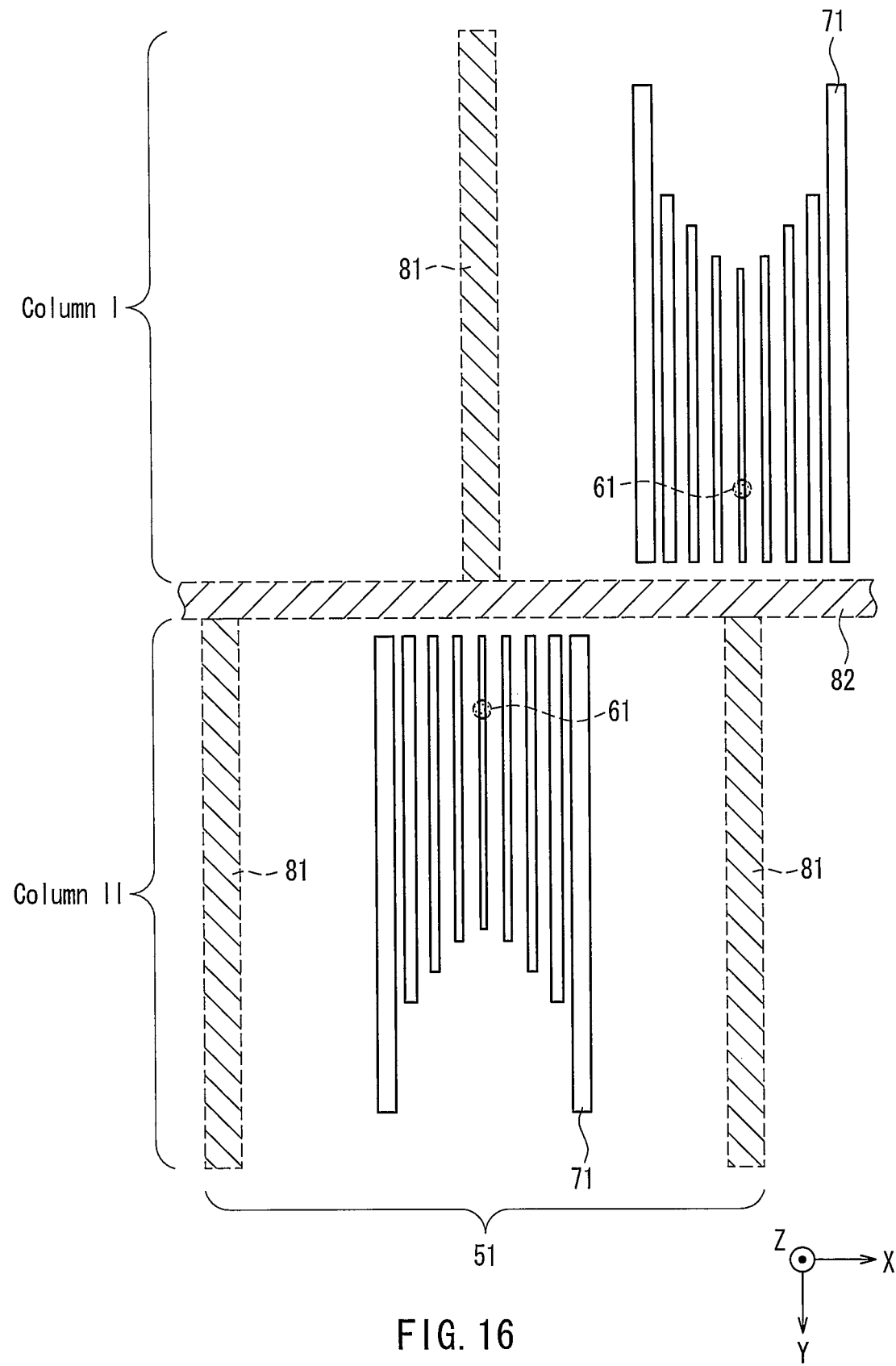
FIG. 16 is a see-through plan view of a vapor deposition block in the manufacturing device for an organic EL element according to Embodiment 2 of the present invention, as viewed from the side where a vapor deposition mask is disposed.

FIG. 16 is a plan view of a vapor deposition block 51, as viewed along the Z axis from the side where the vapor deposition mask 70 is disposed. Similarly to FIG. 13, FIG. 16 is shown as a see-through view showing a vapor deposition source opening 61, limiting plates 81, a second limiting plate 82 and mask openings 71 that constitute the vapor deposition block 51. It should be noted that FIG. 14 is a simplified diagram, and thus the number of mask openings 71 does not match the number of mask openings illustrated in FIG. 16. The pattern (specifically, pitch, width and length) of the mask openings 71 of the present embodiment is designed based on an idea similar to that of Embodiment 1. The following is a description thereof.

The pitch in the X axis direction of a plurality of mask openings 71 that constitute a vapor deposition block 51 is preferably smaller than the pitch in the X axis direction of a plurality of stripe-shaped coating films 90 that are to be formed on the deposition surface of the substrate 10 (see FIG. 15). Furthermore, the pitch in the X axis direction of a plurality of mask openings 71 that constitute a vapor deposition block 51 is preferably constant. With such a preferred configuration, it is possible to easily form a plurality of stripe-shaped coating films 90 on the deposition surface of the substrate 10 at an equal pitch in the X axis direction.

Also, the width (dimension in the X axis direction) of the mask openings 71 is preferably set such that the mask opening 71 located directly above the vapor deposition source opening 61 has the smallest width, and the width of the mask opening 71 is increased as the position of the mask opening 71 is farther away from the position in the X axis direction of the vapor deposition source opening 61 toward the X axis direction. With this configuration, a plurality of stripe-shaped coating films 90 having the same width can be easily formed on the deposition surface of the substrate 10.

Furthermore, the length (dimension in the Y axis direction) of the mask openings 71 is preferably set such that the mask opening 71 located directly above the vapor deposition source opening 61 has the shortest length, and the length of the mask opening 71 is increased as the position of the mask opening 71 is farther away from the position in the X axis direction of the vapor deposition source opening 61 toward the X axis direction. With this preferred configuration, a plurality of stripe-shaped coating films 90 having the same thickness can be easily formed on the deposition surface of the substrate 10.

According to the present embodiment, as described above, in each of the column I and the column II, the pitch in the X axis direction of the vapor deposition blocks 51 can be increased as compared to that of Embodiment 1. Accordingly, the interval between two groups of mask openings that belong to a pair of neighboring vapor deposition blocks 51 in the X axis direction is increased, and therefore flexibility in the design of the mask opening pattern is increased.

In the present embodiment, a plurality of vapor deposition source openings are arranged in two columns located at different positions in the Y axis direction, but the number of columns formed by vapor deposition source openings is not limited to two and may be more. For example, it may be possible to arrange a plurality of vapor deposition source openings in a plurality of columns such that a saw-like shape is formed when viewed along the Z axis. In the case where a plurality of vapor deposition source openings are arranged in a plurality of columns such that their positions in the X direction are not the same, if the number of columns formed by vapor deposition source openings is increased, the interval between neighboring vapor deposition source openings in the X axis direction is further widened.

The present embodiment is the same as Embodiment 1 except for the above-described differences, and produces the same effects as those of Embodiment 1. Also, various modifications mentioned in Embodiment 1 can also be applied to the present embodiment directly or by making an additional change where appropriate.

Embodiment 3

Embodiment 3 will be described, focusing on differences from Embodiments 1 and 2.

Figure 17:
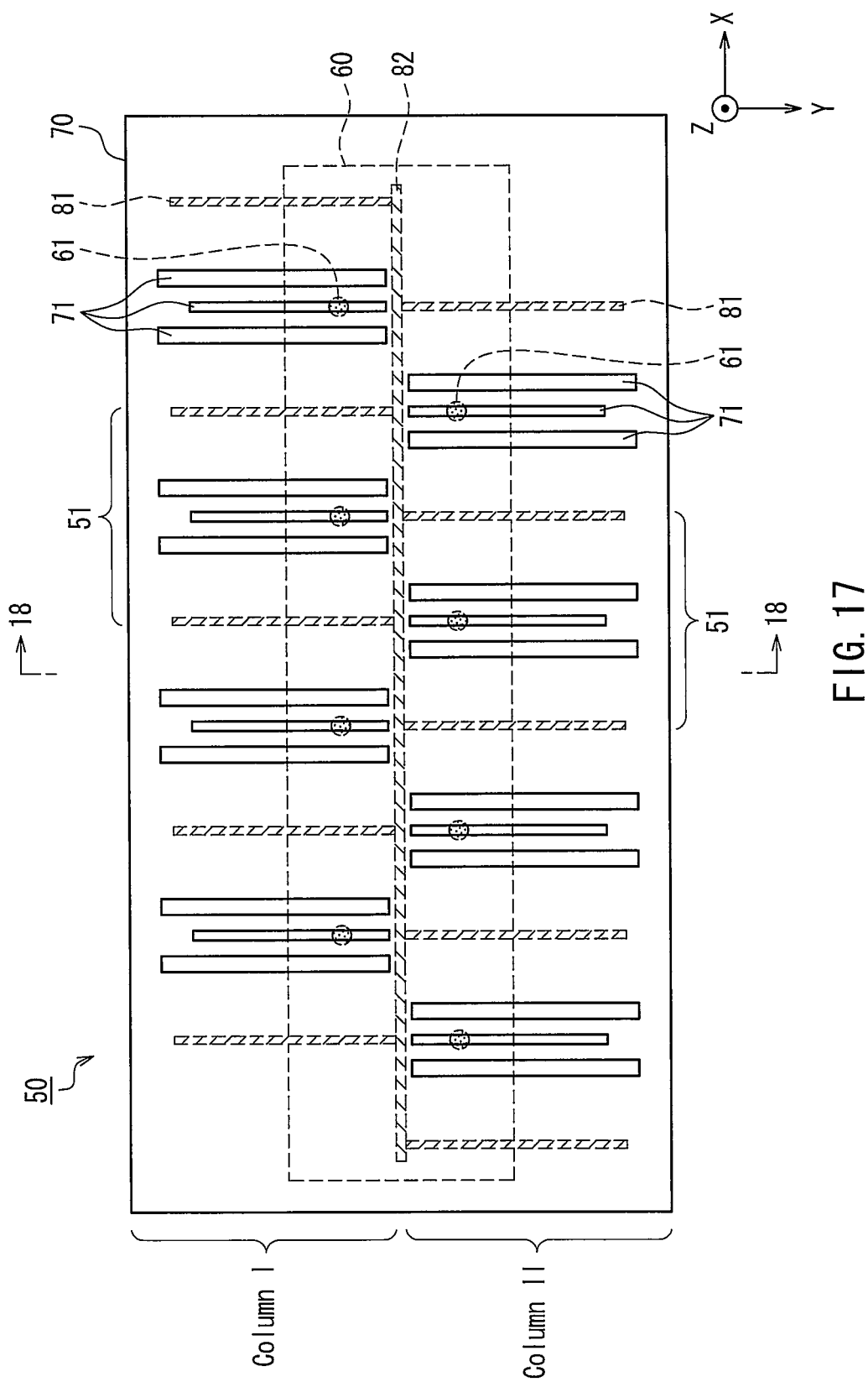
FIG. 17 is a see-through plan view of a vapor deposition unit that constitutes a manufacturing device for an organic EL element according to Embodiment 3 of the present invention, as viewed from the side where a vapor deposition mask is disposed.
Figure 18:
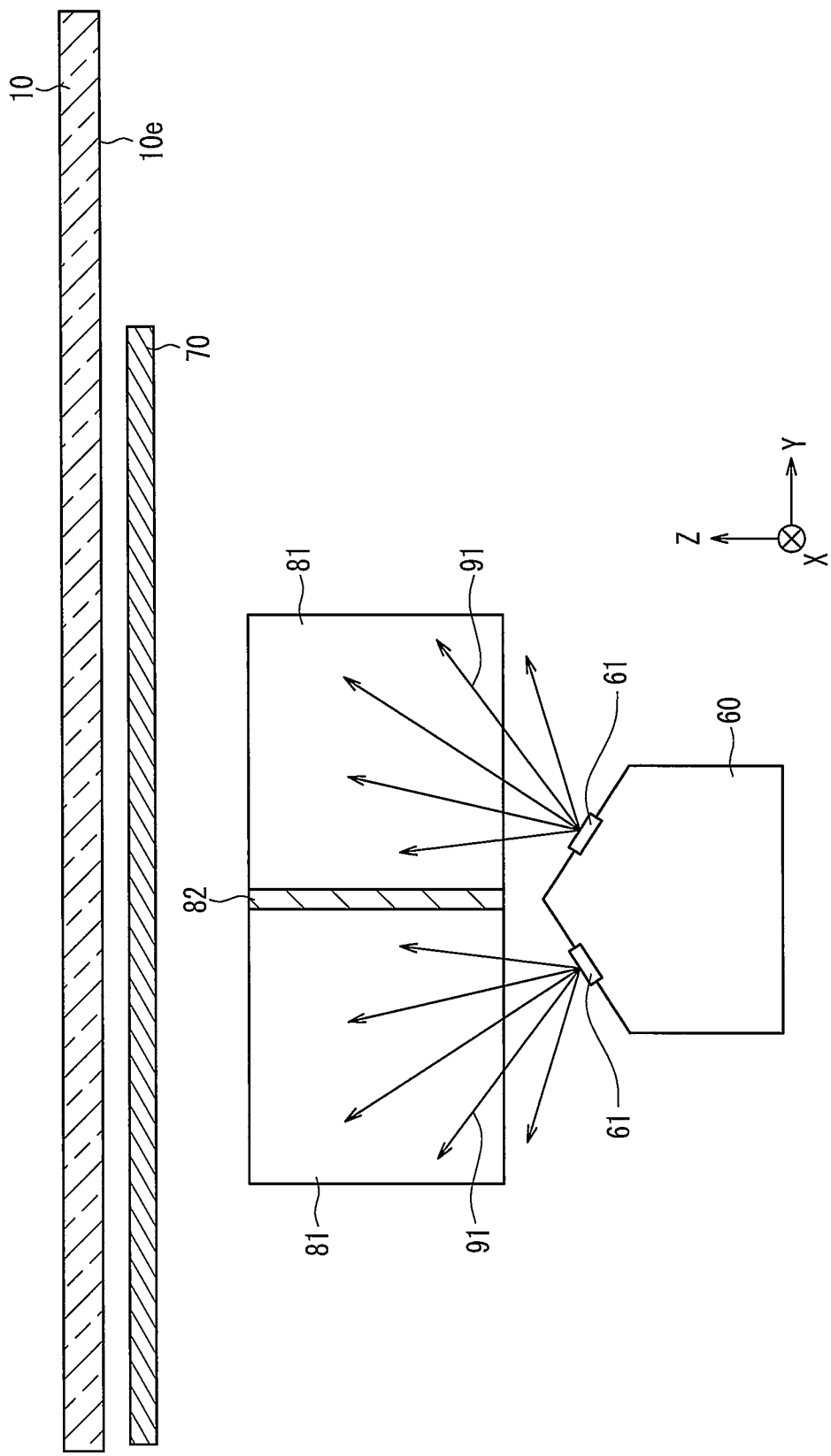
FIG. 18 is a cross-sectional view of a vapor deposition unit that constitutes the manufacturing device for an organic EL element according to Embodiment 3 of the present invention, taken along the line 18-18 of FIG. 17.

FIG. 17 is a plan view of a vapor deposition unit 50 that constitutes a manufacturing device for an organic EL element according to Embodiment 3 of the present invention, as viewed from the side where a vapor deposition mask 70 is disposed along the Z axis. Similarly to FIGS. 10 and 14, FIG. 17 is shown as a see-through view so that the relative relationship between a vapor deposition source 60, a plurality of limiting plates 81 and a vapor deposition mask 70 can be seen. FIG. 18 is a cross-sectional view of the vapor deposition unit 50, taken along a plane parallel to the YZ plane including the line 18-18 of FIG. 17.

In the present embodiment, as shown in FIG. 17, a plurality of vapor deposition source openings formed in the vapor deposition source 60 are arranged in a staggered manner, as in Embodiment 2. However, as shown in FIG. 18, when viewed along the X axis, the vapor deposition source openings 61 of the column I and the vapor deposition source openings 61 of the column II are open in directions opposite to each other with an inclination. Accordingly, the vapor deposition source openings 61 of the column I discharge vapor deposition particles 91 obliquely upward toward the upstream of the movement direction of the substrate 10, and the vapor deposition source openings 61 of the column II discharge vapor deposition particles 91 obliquely upward toward the downstream of the movement direction of the substrate 10.

The configurations of the plurality of limiting plates 81 and the vapor deposition mask 70 are the same as those of Embodiment 2. The dimension in the up and down direction of the second limiting plate 82 is shorter than that of Embodiment 2, and set to be the same as those of the plurality of limiting plates 81.

According to the present embodiment, it is possible to reduce, in particular, the vapor deposition particles 91 that move from one side of the second limiting plate 82 in the Y axis direction to the other side, as compared to Embodiment 2. In other words, migration of vapor deposition particles between the vapor deposition blocks 51 of the column I and the vapor deposition blocks 51 of the column II can be reduced as compared to Embodiment 2.

Accordingly, flexibility in the design of the limiting plates 81 and the second limiting plate 82 is increased such as, for example, reduction of the dimension in the Z axis direction of the second limiting plate 82. Also, flexibility in the design of the mask opening pattern of the vapor deposition mask 70 is also increased.

Also, the occurrence of a blur at both edges of a stripe-shaped coating film 90 formed on the deposition surface 10e of the substrate 10 can be suppressed more easily than in Embodiment 2, and the organic EL element can be created with higher accuracy.

Also, the amount of vapor deposition material that adheres to the second limiting plate 82 is reduced, as a result of which the wasted vapor deposition material can be reduced.

The present embodiment is the same as Embodiment 2 except for the above-described differences, and produces the same effects as those of Embodiment 2. Also, various modifications mentioned in Embodiments 1 and 2 can also be applied to the present embodiment directly or by making an additional change where appropriate.

Embodiment 4

Embodiment 4 will be described, focusing on differences from Embodiments 1 to 3.

Figure 19:
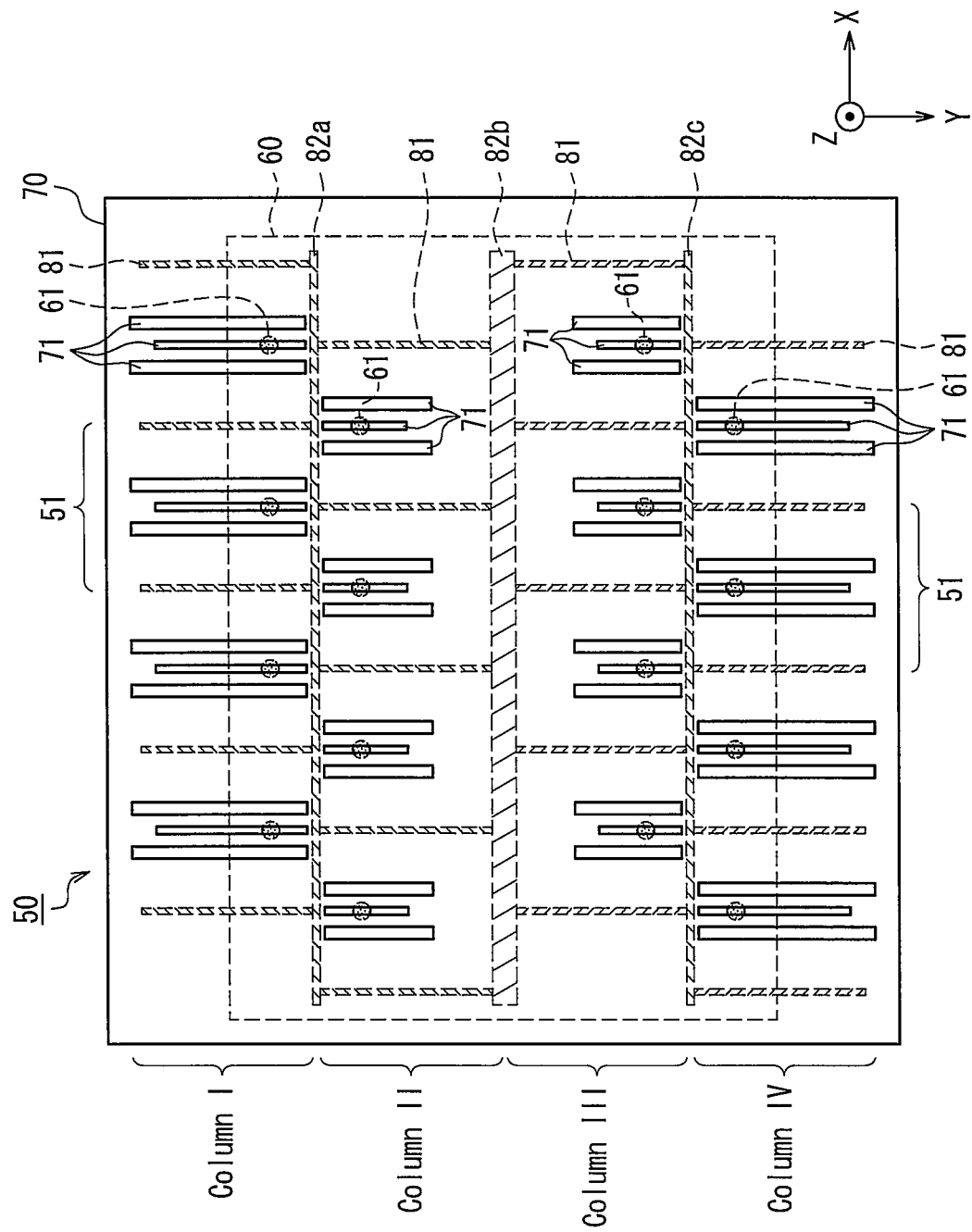
FIG. 19 is a see-through plan view of a vapor deposition unit that constitutes a manufacturing device for an organic EL element according to Embodiment 4 of the present invention, as viewed from the side where a vapor deposition mask is disposed.

FIG. 19 is a plan view of a vapor deposition unit 50 that constitutes a manufacturing device for an organic EL element according to Embodiment 4 of the present invention, as viewed along the Z axis from the side where a vapor deposition mask 70 is disposed. Similarly to FIGS. 10, 14 and 17, FIG. 19 is shown as a see-through view so that the relative relationship between a vapor deposition source 60, a plurality of limiting plates 81 and a vapor deposition mask 70 can be seen.

In Embodiment 2, a plurality of vapor deposition source openings 61 formed in the vapor deposition source 60 are arranged in two columns that are parallel to the X axis as shown in FIG. 14, whereas in the present embodiment, as shown in FIG. 19, a plurality of vapor deposition source openings 61 are arranged in four columns that are parallel to the X axis.

Specifically, in each of a column I, a column II, a column III and a column IV that are arranged in this order from upstream to downstream in the movement direction of the substrate 10 in the vapor deposition unit 50, a plurality of vapor deposition source openings 61 are arranged at an equal pitch in a direction parallel to the X axis. A plurality of limiting plates 81 and mask openings 71 are also arranged in four columns that are parallel to the X axis so as to correspond to the arrangement of the vapor deposition source openings 61. As in Embodiments 1 and 2, in the present embodiment as well, a pair of neighboring limiting plates 81 in the X axis direction, a single vapor deposition source opening 61 provided between the pair of limiting plates 81 and a plurality of mask openings 71 provided between the pair of limiting plates 81 together constitute a single vapor deposition block 51.

A plurality of vapor deposition blocks 51 are arranged in a staggered manner in two neighboring columns in the Y axis direction. In the column I and the column III, the position in the X axis direction of the vapor deposition blocks 51 as well as the position in the X axis direction of the vapor deposition source openings 61, the limiting plates 81 and the mask openings 71 that constitute the vapor deposition blocks 51 are the same. Likewise, in the column II and the column IV, the position in the X axis direction of the vapor deposition blocks 51 as well as the position in the X axis direction of the vapor deposition source openings 61, the limiting plates 81 and the mask openings 71 that constitute the vapor deposition blocks 51 are the same.

A second limiting plate 82a extending in the X axis direction is provided between the limiting plates 81 of the column I and the limiting plates 81 of the column II, a second limiting plate 82b extending in the X axis direction is provided between the limiting plates 81 of the column II and the limiting plates 81 of the column III, and a second limiting plate 82c extending in the X axis direction is provided between the limiting plates 81 of the column III and the limiting plates 81 of the column IV. The second limiting plates 82a, 82b and 82c prevent the vapor deposition particles discharged from the vapor deposition source openings 61 on one side of the second limiting plates 82a, 82b and 82c in the Y axis direction from entering the mask openings 71 provided on the other side in the Y axis direction.

As in Embodiment 3 (see FIG. 18), when viewed along the X axis, the vapor deposition source openings 61 of the column I and the vapor deposition source openings 61 of the column II are open in directions opposite to each other with an inclination. Likewise, when viewed along the X axis, the vapor deposition source openings 61 of the column III and the vapor deposition source openings 61 of the column IV are open in directions opposite to each other with an inclination.

Because the vapor deposition source openings 61 are inclined as described above, particularly, in order to prevent the vapor deposition particles discharged from the vapor deposition source openings 61 on one side of the second limiting plate 82b in the Y axis direction from entering the mask openings 71 arranged on the other side in the Y axis direction, the interval between the column II and the column III in the Y axis direction is set to be larger than that between the column I and the column II in the Y axis direction and that between the column III and the column IV in the Y axis direction. This is clearly seen particularly from the pitch of vapor deposition source openings 61 in the Y axis direction. Furthermore, the length in the Y axis direction of the mask openings 71 of the column II and the column III is set to be shorter than that of the mask openings 71 of the column I and the column IV.

This enables the thickness (dimension in the Y axis direction) of the second limiting plate 82b to be greater than that of the second limiting plates 82a and 82c, which makes it easy to, for example, install a cooling device (for example, a cooling water pipe through which cooling water flows) in the second limiting plate 82b. In this case, the limiting plates 81 of the column I to the column IV can be cooled by heat conduction to the second limiting plate 82b.

In the present embodiment as well, as in Embodiments 1 to 3, the substrate 10 is moved in the Y axis direction while the vapor deposition particles are discharged from the plurality of vapor deposition source openings 61, so as to cause the vapor deposition particles to adhere to the deposition surface of the substrate 10, whereby a plurality of stripe-shaped coating films 90 parallel to the Y axis direction are formed.

According to the present embodiment, as a result of the limiting plates 81 and the second limiting plates 82a, 82b and 82c being provided, as in Embodiments 1 to 3, the occurrence of a blur at both edges of a stripe-shaped coating film 90 formed on the deposition surface of the substrate 10 can be suppressed significantly.

Furthermore, the present embodiment produces the following effects.

In the present embodiment, two mask openings 71 of the column I and the column III that are located at the same position in the X axis direction form one common coating film 90, and two mask openings 71 of the column II and the column IV that are located at the same position in the X axis direction form one common coating film 90. Each coating film 90 formed on the substrate 10 is formed by the vapor deposition particles that have passed through two mask openings 71 that are located at the same position in the X axis direction. The total length in the Y axis direction of two mask openings 71 that are located at the same position in the X axis direction is set in consideration of the thickness of a coating film 90 that is to be formed. In other words, it is possible to freely set how the total length in the Y axis direction of two mask openings 71 required to form a coating film 90 having a desired thickness is allocated to the mask openings 71 that belong to different columns but are located at the same position in the X axis direction. Likewise, various conditions required of the vapor deposition source openings 61 and the limiting plates 81 in each column can be freely set as long as desired coating films 90 can be formed. Forming a coating film 90 in two stages by using two mask openings 71 belonging to different columns as described above increases flexibility in the design of the mask openings 71, the limiting plates 81, the vapor deposition source openings 61 and the like that constitute the vapor deposition blocks 51 in each column.

Figure 20:
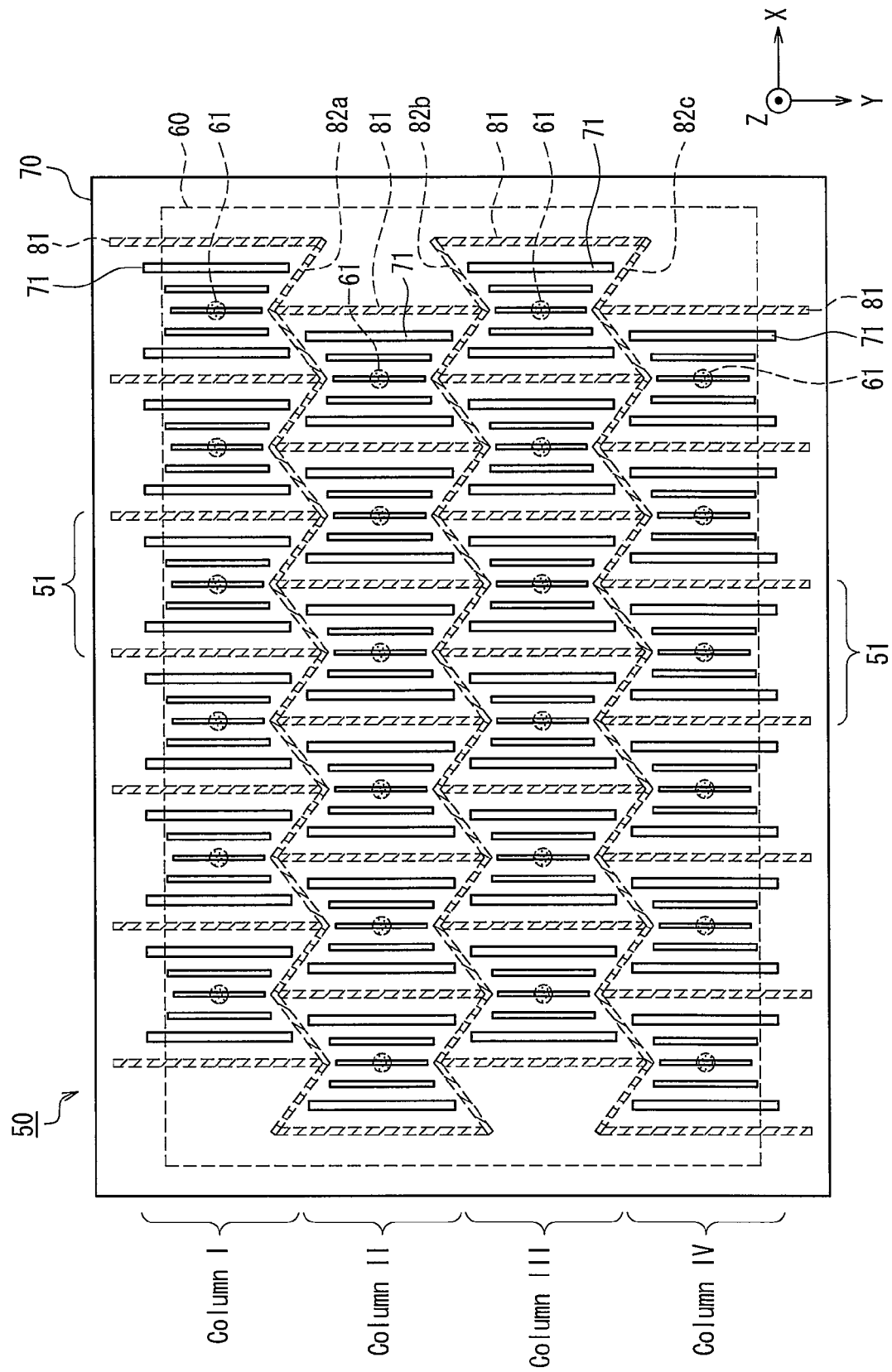
FIG. 20 is a see-through plan view of another vapor deposition unit that constitutes the manufacturing device for an organic EL element according to Embodiment 4 of the present invention, as viewed from the side where a vapor deposition mask is disposed.

FIG. 20 is a plan view of another vapor deposition unit 50 that constitutes the manufacturing device for an organic EL element according to Embodiment 4 of the present invention, as viewed along the Z axis from the side where a vapor deposition mask 70 is disposed. Similarly to FIG. 19, FIG. 20 is shown as a see-through view so that the relative relationship between a vapor deposition source 60, a plurality of limiting plates 81, second limiting plates 82a, 82b and 82c, and a vapor deposition mask 70 can be seen.

FIG. 20 is different from FIG. 19 in that the second limiting plates 82a, 82b and 82c are bent in a zigzag pattern to decrease the pitch of columns in the Y axis direction. This configuration increases the arrangement density of vapor deposition source openings 61 and enables the size of the vapor deposition unit 50 to be reduced. In FIG. 20, all of the vapor deposition source openings 61 are open upward in the Z axis direction.

Also, in FIG. 20, the pattern of mask openings 71 of the vapor deposition mask 70 is different from that of FIG. 19, and a single coating film 90 is formed by the vapor deposition particles that have passed through four mask openings 71 in the column I to the column IV that are aligned substantially linearly in the Y axis direction. The vapor deposition unit 50 shown in FIG. 20 forms a coating film 90 in four stages by using four mask openings 71 belonging to different columns, and thus the flexibility in the design of the mask openings 71, the limiting plates 81, the vapor deposition source openings 61 and the like that constitute the vapor deposition blocks 51 in each column is further increased. Also, throughput for mass production of the organic EL element is improved.

In FIGS. 19 and 20, a plurality of vapor deposition blocks 51 are disposed in four columns, but the present invention is not limited thereto, and the vapor deposition blocks 51 may be disposed in three columns, or five or more columns. Also, the number of mask openings 71 that form a single coating film 90 is not limited to two as shown in FIG. 19 or four as shown in FIG. 20, and may be three, or five or greater. Generally, flexibility in the design of the configuration of the vapor deposition blocks 51 including mask openings 71 increases as the number of mask openings 71 that form a single coating film 90 increases.

The present embodiment is the same as Embodiments 1 to 3 except for the above-described differences, and produces the same effects as those of Embodiments 1 to 3. Also, various modifications mentioned in Embodiments 1 to 3 can also be applied to the present embodiment directly or by making an additional change where appropriate.

Embodiment 5

Embodiment 5 will be described, focusing on differences from Embodiment 1.

Figure 21:
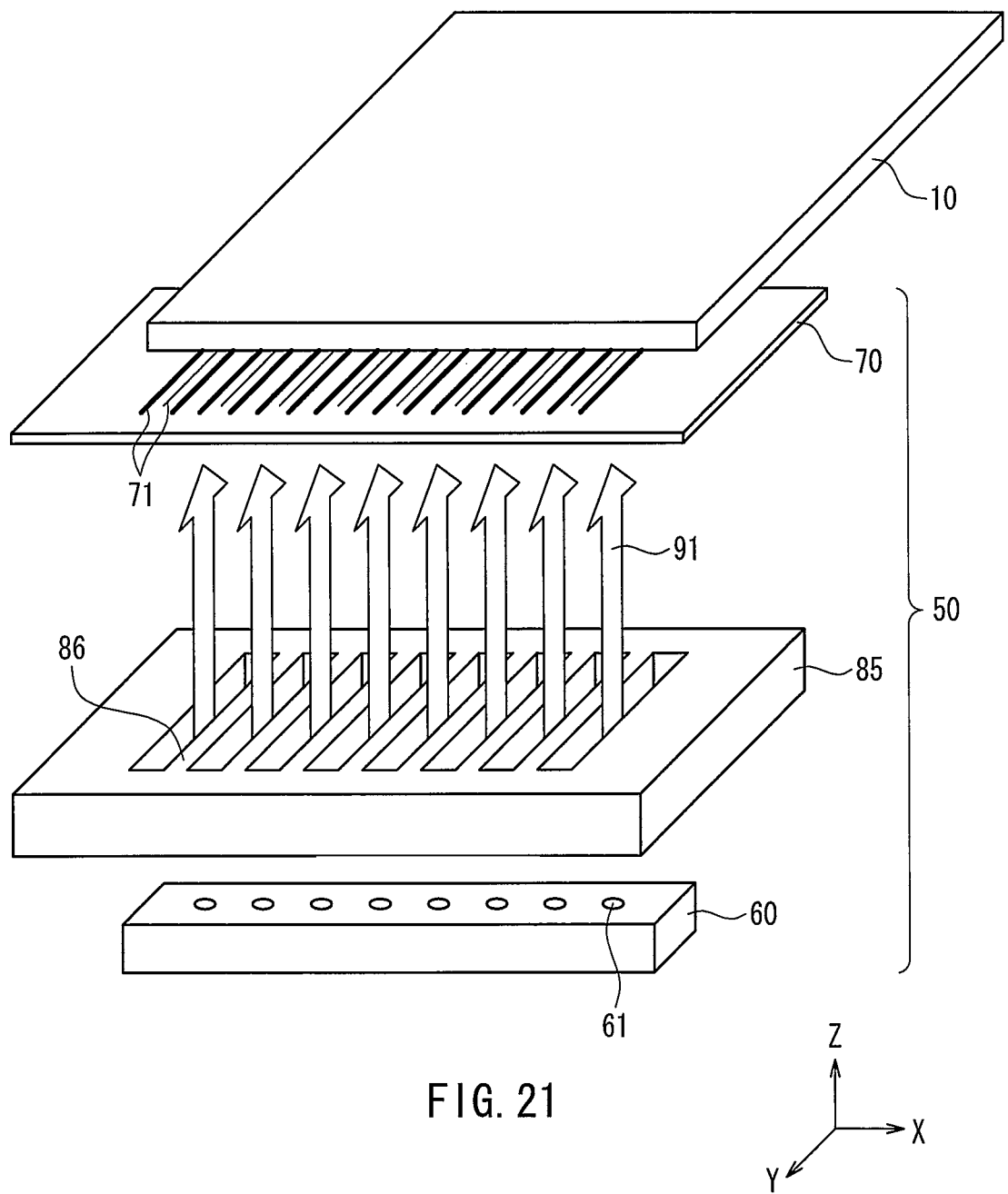
FIG. 21 is a perspective view showing a schematic configuration of a manufacturing device for an organic EL element according to Embodiment 5 of the present invention.
Figure 22:
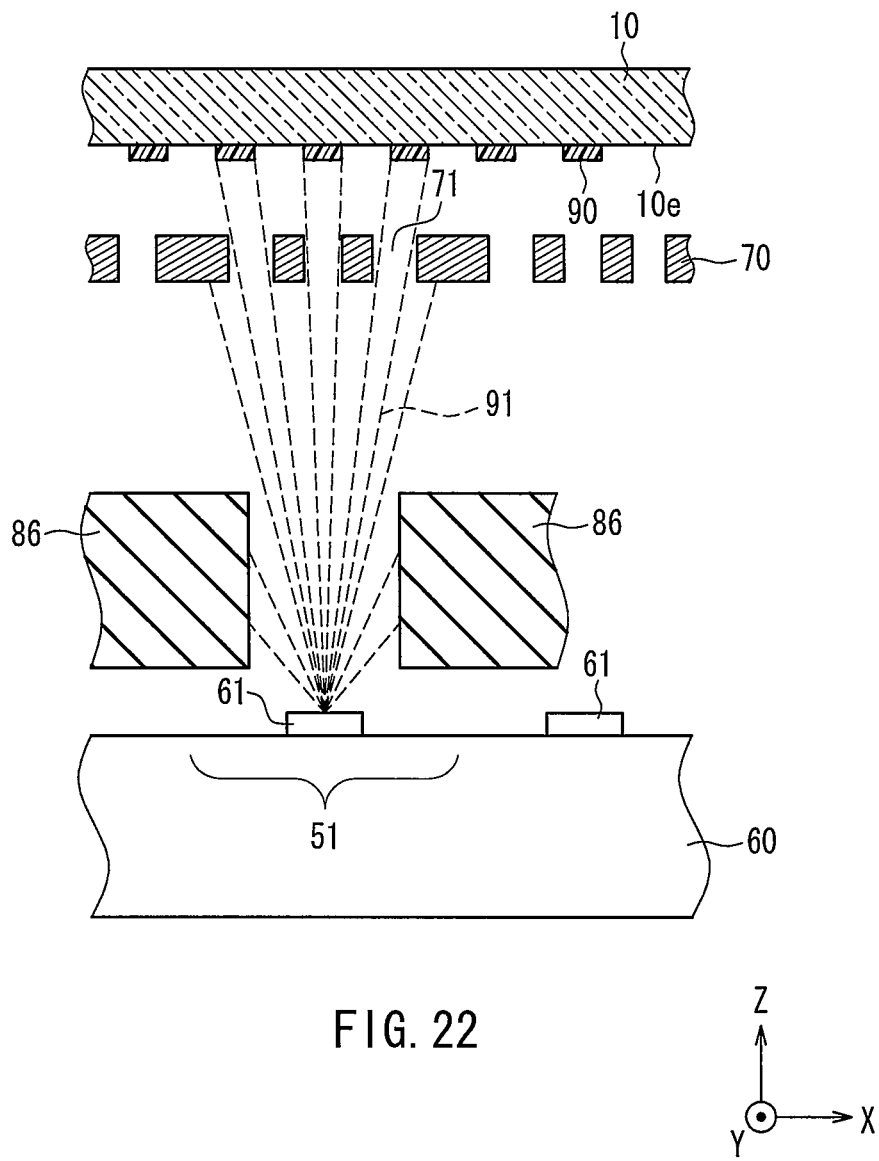
FIG. 22 is a cross-sectional view of the manufacturing device for an organic EL element according to Embodiment 5 of the present invention, showing the flow of vapor deposition particles in a vapor deposition block.

FIG. 21 is a perspective view showing a schematic configuration of a manufacturing device for an organic EL element according to Embodiment 5 of the present invention. FIG. 22 is a cross-sectional view showing the flow of vapor deposition particles 91 in a vapor deposition block 51 on a plane parallel to the XZ plane passing through a vapor deposition source opening 61 in the present embodiment.

The present embodiment is different from Embodiment 1 in that a plurality of limiting plates 86 are formed integrally as a limiting plate block 85. The limiting plates 86 have the same function as that of the limiting plates 81 of Embodiment 1.

The limiting plate block 85 having a plurality of limiting plates 86 can be created by, for example, forming a plurality of through holes for allowing vapor deposition particles 91 to pass therethrough in a board having a predetermined thickness. Because there are restrictions and the like to the processing for forming through holes, in some cases, it may be difficult to increase the thickness (dimension in the Z axis direction) of the limiting plate block 85. Alternatively, it may be difficult to reduce the thickness (dimension in the X axis direction) of the limiting plates 86. In this case, as shown in FIG. 22, the function of the limiting plates 86 can be ensured by, for example, disposing the limiting plate block 85 at a position close to the vapor deposition source 60.

In order to increase the dimension in the Z axis direction of the limiting plates 86, a plurality of limiting plate blocks 85 may be stacked in the Z axis direction.

The present embodiment is the same as Embodiment 1 except for the differences described above. In the present embodiment as well, as in Embodiment 1, the substrate 10 is moved in the Y axis direction while the vapor deposition particles 91 are discharged from the plurality of vapor deposition source openings 61, so as to cause the vapor deposition particles 91 to adhere to the deposition surface 10e of the substrate 10, whereby a plurality of stripe-shaped coating films 90 parallel to the Y axis direction are formed.

According to the present embodiment, a plurality of limiting plates 86 are formed integrally as a limiting plate block 85. Accordingly, the need to perform positioning of individual limiting plates 86 is eliminated, and therefore the positional accuracy of the limiting plates 86 is improved. Also, the limiting plates 86 can be replaced by replacing the limiting plate block 85 including the plurality of limiting plates 86, which makes the task of replacing the limiting plates 86 easy, and thus the burden on maintenance in mass production can be reduced.

Also, it is easy to install an additional device such as a cooling device (for example, a cooling water pipe through which cooling water flows) for cooling the limiting plates 86. For example, a cooling water pile can be installed in a frame of the limiting plate block 85 surrounding the plurality of limiting plates 86. Also, because a plurality of limiting plates 86 are integrated together, good heat conduction properties are obtained, and cooling performance can be improved.

Depending on the dimensions of the limiting plate block 85, the limiting plate block 85 can be used as a shutter for blocking the vapor deposition particles 91 by adding a mechanism that moves the limiting plate block 85 in the X axis direction or the Y axis direction.

For example, as described above, in the case where the thickness (dimension in the X axis direction) of the limiting plates 86 is large (particularly in the case where the thickness of the limiting plates 86 is larger than the interval between each neighboring limiting plates 86 in the X axis direction), it may be possible to, by moving the limiting plate block 85 in the X axis direction, block the vapor deposition particles 91 at the lower surface of the limiting plates 86 facing the vapor deposition source 60.

Alternatively, it may be possible to, by moving the limiting plate block 85 in the Y axis direction, block the vapor deposition particles 91 at the lower surface of a portion that constitutes the frame surrounding the limiting plate block 85 and is parallel to the X axis.

As described above, in the present embodiment, in some cases, it may be difficult to increase the thickness of the limiting plate block 85. However, in this case, the space between the limiting plate block 85 and the vapor deposition source 60 and/or the space between the limiting plate block 85 and the vapor deposition mask 70 are/is widened. Accordingly, the degree of vacuum around the limiting plates 86 can be easily maintained and the load on a vacuum pump can be reduced. Also, contamination can be reduced, and therefore coating films 90 with few defects can be formed. Furthermore, the present embodiment is advantageous from the viewpoint of heat dissipation of the limiting plates 86 and ease of replacement of the limiting plate block 85.

The present embodiment is the same as Embodiment 1 except for the above-described differences, and produces the same effects as those of Embodiment 1. Also, various modifications mentioned in Embodiment 1 can also be applied to the present embodiment directly or by making an additional change where appropriate.

The concept of integrating a plurality of limiting plates illustrated in the present embodiment is applicable to all of the embodiments described in this specification, and in this case, the effects described above can be obtained. As discussed in Embodiments 2, 3 and 4, in order to dispose a plurality of limiting plates in a plurality of columns, it is sufficient to form a plurality of through holes for allowing vapor deposition particles to pass therethrough in a board having a predetermined thickness along a plurality of columns. It is thereby possible to form a limiting plate block in which limiting plates and a second limiting plate are integrated together.

Embodiment 6

Embodiment 6 will be described, focusing on differences from Embodiment 1.

Figure 23:
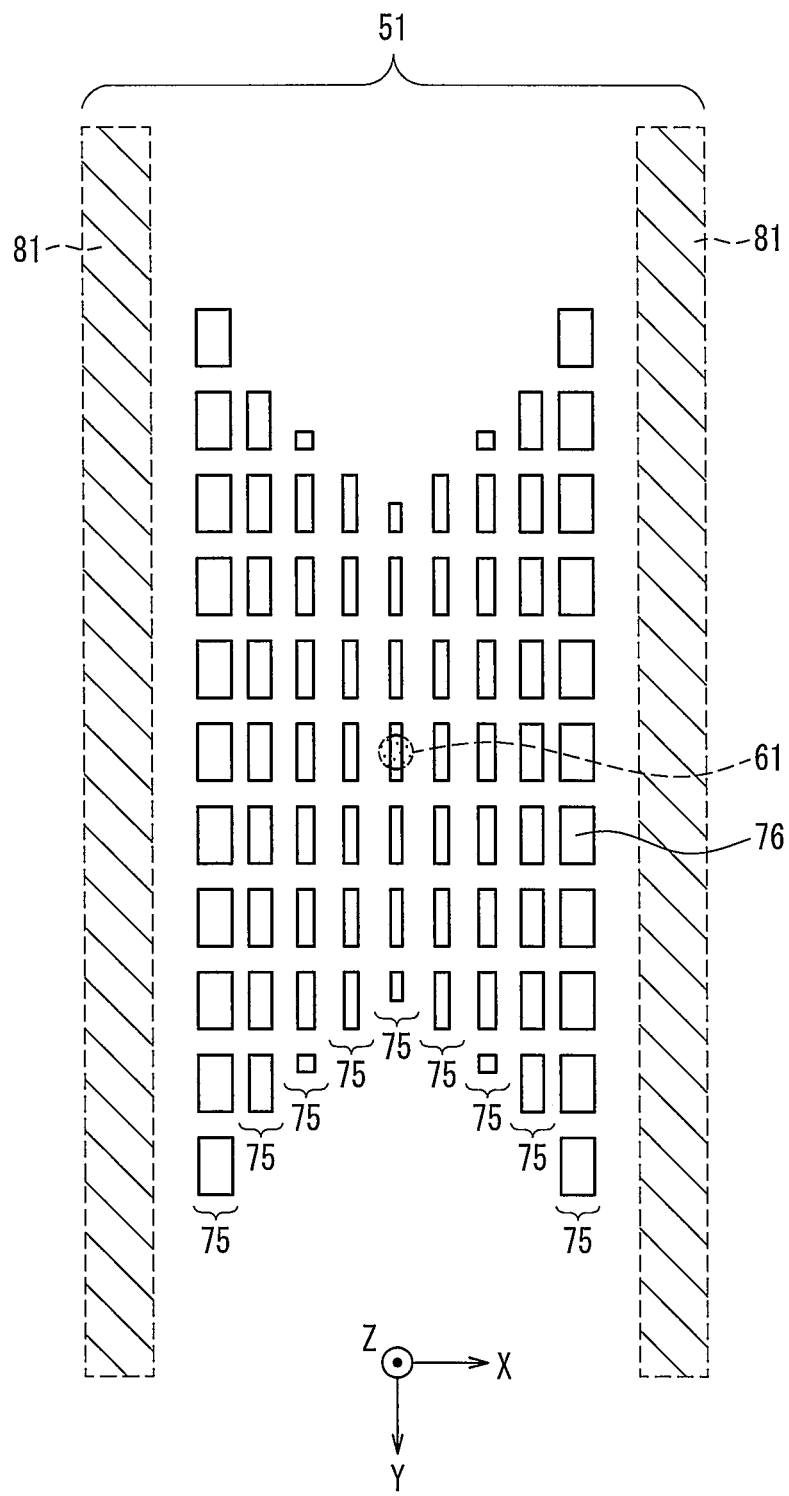
FIG. 23 is a see-through plan view of a vapor deposition block in a manufacturing device for an organic EL element according to Embodiment 6 of the present invention, as viewed from the side where a vapor deposition mask is disposed.

FIG. 23 is a plan view of a vapor deposition block 51 of a manufacturing device for an organic EL element according to Embodiment 6 of the present invention, as viewed along the Z axis from the side where a vapor deposition mask 70 is disposed. Similarly to FIG. 13, FIG. 23 is shown as a see-through view showing only a vapor deposition source opening 61, a pair of limiting plates 81 and mask openings 76 that constitute the vapor deposition block 51.

In Embodiment 1, as shown in FIG. 13, with respect to a single vapor deposition source opening 61, a plurality of mask openings 71 at different positions in the X axis direction are formed. Each mask opening 71 is a slit-shaped opening extending in the Y axis direction. The mask opening pattern of the present embodiment has a shape similar to that obtained by dividing each mask opening 71 of Embodiment 1 into a plurality of portions in the Y axis direction. Specifically, as shown in FIG. 23, with respect to a single vapor deposition source opening 61, a plurality of mask opening columns 75 at different positions in the X axis direction are disposed. Each mask opening column 75 is constituted by a plurality of mask openings 76 arranged in the Y axis direction.

The plurality of mask openings 76 aligned in the Y axis direction form the same coating film 90. In order to form a plurality of stripe-shaped coating films 90 having the same thickness on the substrate 10, the total dimension in the Y axis direction of a plurality of mask openings 76 that constitute the mask opening columns 75 is set such that the mask opening column 75 located directly above the vapor deposition source opening 61 has the smallest value and the total dimension is increased as the position of mask opening column 75 is farther away from the position in the X axis direction of the vapor deposition source opening 61 toward the X axis direction. In FIG. 23, the total dimension in the Y axis direction of the mask openings 76 aligned in the Y axis direction is changed by changing the number of mask openings 76 that constitute a mask opening column 75. In other words, the number of mask openings 76 constituting the mask opening columns 75 is set such that the mask opening column 75 located directly above the vapor deposition source opening 61 has the smallest number and the number of mask openings 76 is increased as the position of the mask opening column 75 is farther away from the position in the X axis direction of the vapor deposition source opening 61 toward the X axis direction.

The position in the X axis direction of each mask opening column 75 and the width (dimension in the X axis direction) of the mask openings 76 constituting each mask opening column 75 are determined in the same manner as in Embodiment 1.

In FIG. 23, the mask openings 76 are arranged at a constant pitch in the Y axis direction, but the present invention is not limited thereto. The pitch of mask openings 76 in the Y axis direction is not necessarily constant in a mask opening column 75, and may be different among a plurality of mask opening columns 75. Also, the position in the Y axis direction of the mask openings 76 may vary between neighboring mask opening columns 75 in the X axis direction.

In FIG. 23, all of the plurality of mask opening columns 75 are constituted by two or more mask openings 76, but at least one of the plurality of mask opening columns 75 may be replaced with a single slit-shaped opening extending in the Y axis direction.

In order to change the total dimension in the Y axis direction of the mask openings 76 constituting the mask opening columns 75 as described above, the dimension in the Y axis direction of the mask openings 76 constituting the mask opening columns 75 may be changed for each mask opening column 75, instead of changing the number of mask openings 76 constituting the mask opening columns 75 for each mask opening column 75 as shown in FIG. 23.

The present embodiment eliminates the need to form slit-shaped mask openings having a large dimension in the Y axis direction in the vapor deposition mask 70, and therefore reduction in the strength of the vapor deposition mask 70 caused by forming mask openings can be minimized. Also, the dimensional stability of the vapor deposition mask 70 is improved.

Also, the strength and dimensional stability of the vapor deposition mask 70 can be easily improved by increasing the thickness (dimension in the Z axis direction) of a bridge portion between neighboring mask openings 76 in the Y axis direction or adding a reinforcing member to the bridge portion.

Furthermore, when cooling the vapor deposition mask 70, the bridge portion between neighboring mask openings 76 in the Y axis direction contributes to the improvement of heat conduction properties, and therefore temperature variations can be reduced.

The concept of replacing slit-shaped mask openings 71 with mask opening columns 75 each including a plurality of mask openings 76 aligned in the Y axis direction illustrated in the present embodiment is applicable to all of the embodiments described in this specification, and in this case, the effects described above can be obtained.

Embodiment 7

Embodiment 7 will be described, focusing on differences from Embodiment 1.

Figure 24:
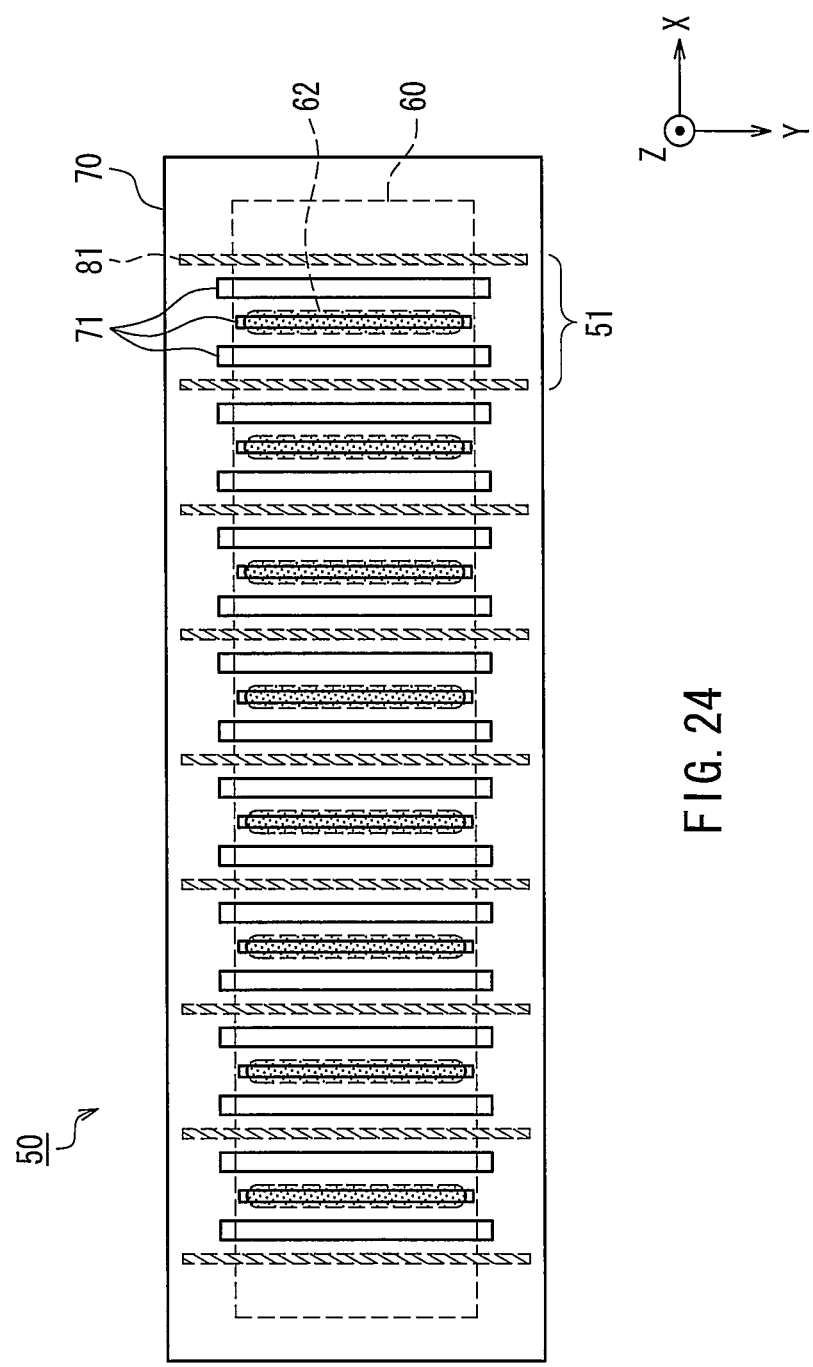
FIG. 24 is a see-through plan view of a vapor deposition unit that constitutes a manufacturing device for an organic EL element according to Embodiment 7 of the present invention, as viewed from the side where a vapor deposition mask is disposed.

FIG. 24 is a plan view of a vapor deposition unit 50 that constitute a manufacturing device for an organic EL element according to Embodiment 7 of the present invention, as viewed along the Z axis from the side where a vapor deposition mask 70 is disposed. Similarly to FIG. 10, FIG. 24 is shown as a see-through view so that the relative relationship between a vapor deposition source 60, a plurality of limiting plates 81 and a vapor deposition mask 70 can be seen.

As the openings for discharging vapor deposition particles from the vapor deposition source 60, minute circular vapor deposition source openings 61 are used in Embodiment 1. In the present embodiment, slit-shaped vapor deposition source openings 62 extending in the Y axis direction are used.

The present embodiment is the same as Embodiment 1 except that the shape of vapor deposition source openings is different. However, it is preferable that the dimensions in the Y axis direction of the mask openings 71 and the limiting plates 81 are set as appropriate according to the length (dimension in the Y axis direction) of the vapor deposition source openings 62.

In the present embodiment as well, as in Embodiment 1, the substrate 10 is moved in the Y axis direction while the vapor deposition particles are discharged from the plurality of vapor deposition source openings 62, so as to cause the vapor deposition particles to adhere to the deposition surface of the substrate 10, whereby a plurality of stripe-shaped coating films 90 parallel to the Y axis direction are formed.

According to the present embodiment, the area of the vapor deposition source openings 62 can be set larger than that of the vapor deposition source openings 61 of Embodiment 1, and thus the amount of vapor deposition particles discharged from the vapor deposition source openings 62 is increased. Accordingly, the deposition rate can be improved, whereby throughput for mass production can be improved.

The present embodiment is the same as Embodiment 1 except for the above-described differences, and produces the same effects as those of Embodiment 1. Also, various modifications mentioned in Embodiment 1 can also be applied to the present embodiment directly or by making an additional change where appropriate.

The slit-shaped vapor deposition source openings 62 illustrated in the present embodiment is applicable to Embodiments 1 to 6 described above, and in this case, the effects described above can be obtained.

Embodiment 8

Embodiment 8 will be described, focusing on differences from Embodiment 1.

Figure 25:
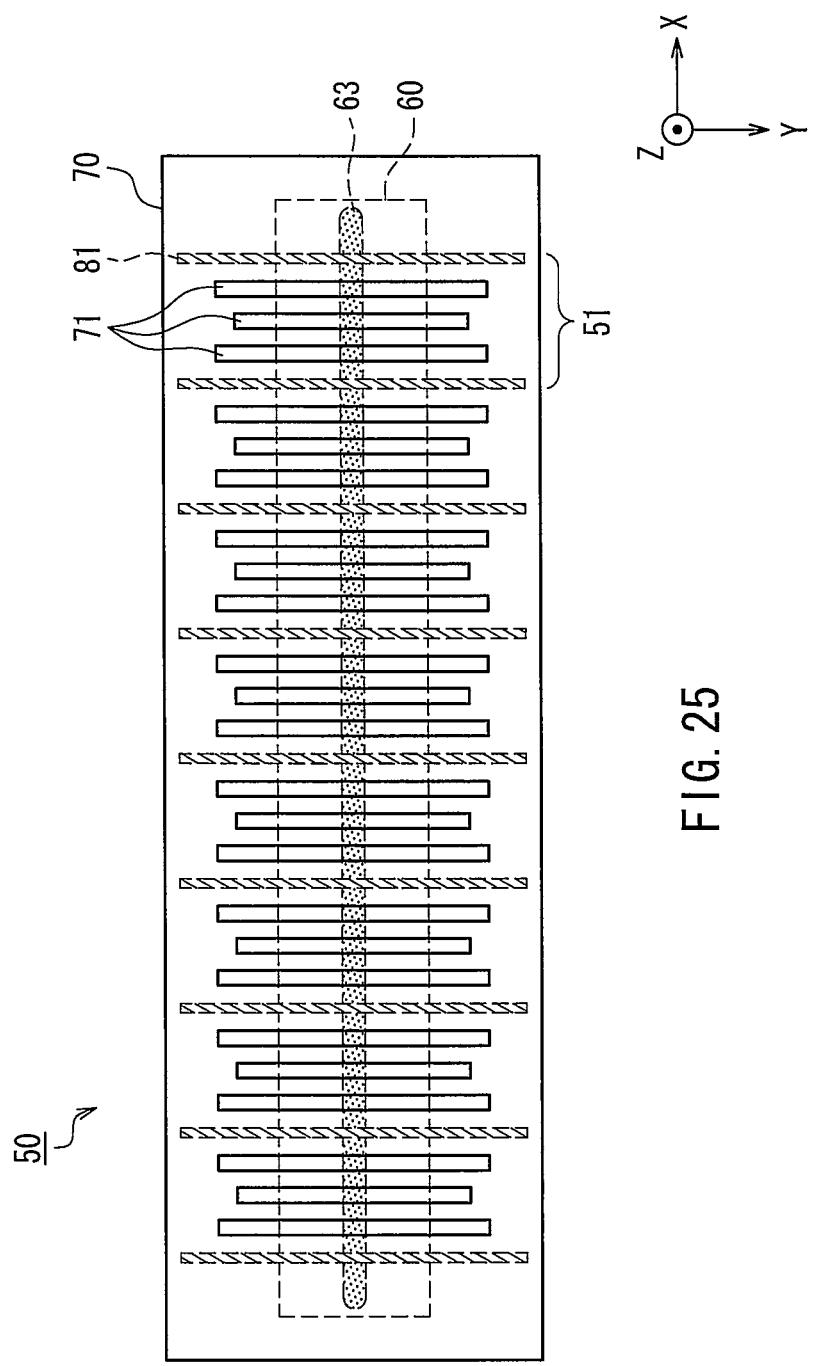
FIG. 25 is a see-through plan view of a vapor deposition unit that constitutes a manufacturing device for an organic EL element according to Embodiment 8 of the present invention, as viewed from the side where a vapor deposition mask is disposed.

FIG. 25 is a plan view of a vapor deposition unit 50 that constitutes a manufacturing device for an organic EL element according to Embodiment 8 of the present invention, as viewed along the Z axis from the side where a vapor deposition mask 70 is disposed. Similarly to FIG. 10, FIG. 25 is shown as a see-through view so that the relative relationship between a vapor deposition source 60, a plurality of limiting plates 81 and a vapor deposition mask 70 can be seen.

As the openings for discharging vapor deposition particles from the vapor deposition source 60, minute circular vapor deposition source openings 61 are used in Embodiment 1. In the present embodiment, a slit-shaped vapor deposition source opening 63 extending in the X axis direction is used. The vapor deposition source opening 63 extends in the X axis direction across the limiting plates 81 in the Y axis direction. In FIG. 25, the vapor deposition source opening 63 continuously extends in the X axis direction over a wide range that is longer than the distance between two outermost limiting plates 81 of the plurality of limiting plates 81 aligned in the X axis direction.

Figure 26:
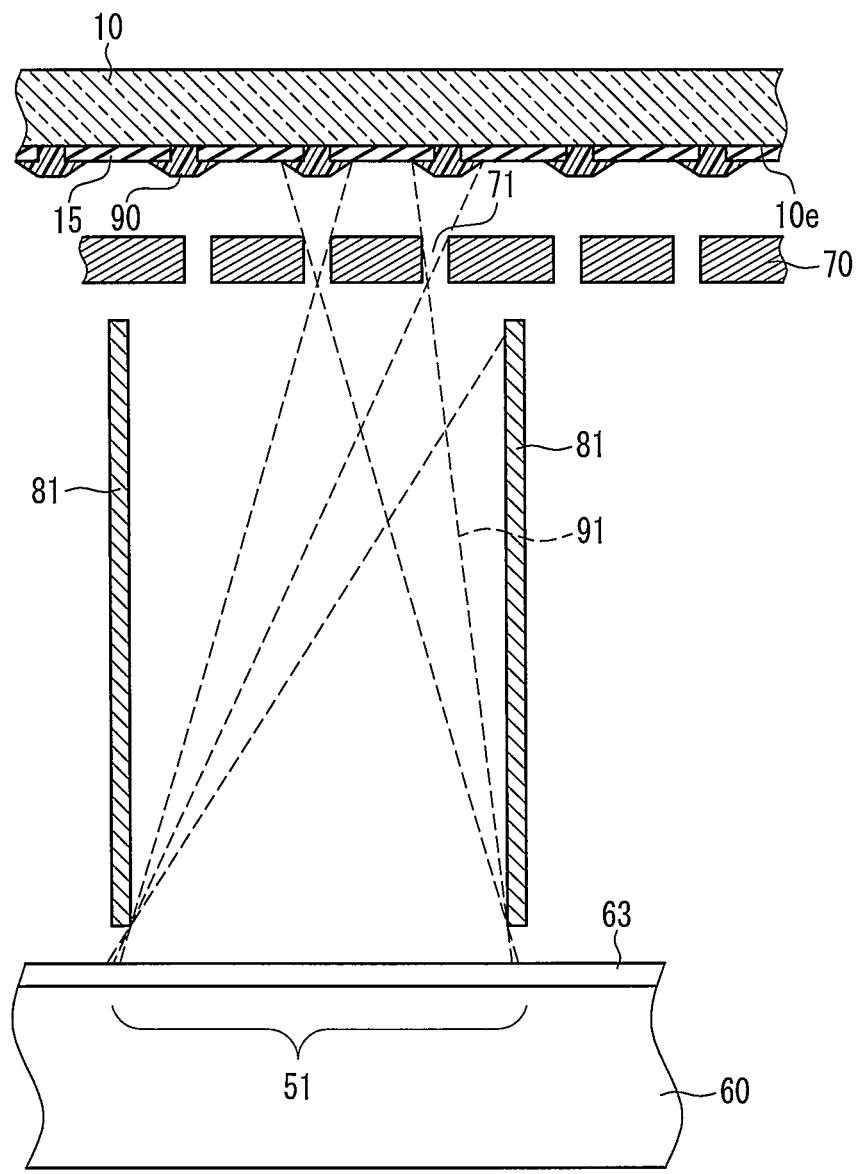
FIG. 26 is a cross-sectional view of the manufacturing device for an organic EL element according to Embodiment 8 of the present invention, showing the flow of vapor deposition particles in a vapor deposition block.

FIG. 26 is a cross-sectional view showing the flow of vapor deposition particles 91 in a vapor deposition block 51 on a plane parallel to the XZ plane passing through the vapor deposition source opening 63. In the present embodiment as well, the limiting plates 81 limit the incidence angle of the vapor deposition particles 91 entering the mask openings 71 on a projection onto the XZ plane. Preferably, the limiting plates 81 prevent the vapor deposition particles 91 discharged from a portion of the vapor deposition source opening 63 located on one side of the limiting plate 81 in the X axis direction from entering the mask openings 71 located on the other side.

In the present embodiment as well, as in Embodiment 1, the substrate 10 is moved in the Y axis direction while the vapor deposition particles 91 are discharged from the vapor deposition source opening 63, so as to cause the vapor deposition particles 91 to adhere to the deposition surface 10e of the substrate 10, whereby a plurality of stripe-shaped coating films 90 parallel to the Y axis direction are formed.

According to the present embodiment, the vapor deposition source opening 63 is a slit-shaped opening extending in the X axis direction, and therefore as can be seen from FIG. 26, the maximum incidence angle of the vapor deposition particles 91 entering the mask openings 71 is greater than that of Embodiment 1. Accordingly, the width We of the thickness tapered portions 990e shown in FIG. 7 becomes larger than that of Embodiment 1.

However, in the present embodiment, no problem substantially arises even when the width We of the thickness tapered portions 990e becomes large by designing the vapor deposition blocks 51 as follows.

As described above, an edge cover 15 having a predetermined pattern is formed on the deposition surface of the substrate 10 in advance (see FIG. 3). The coating films 90 are formed in the openings of the edge cover 15.

Accordingly, firstly, the mask openings 71, the limiting plates 81 and the like are designed such that the thickness of the coating films 90 is constant at least in the openings of the edge cover 15 (specifically, such that the thickness tapered portions 990e are not formed in the openings of the edge cover 15).

Secondly, the mask openings 71, the limiting plates 81 and the like are designed such that the vapor deposition particles 91 that have passed through a mask opening 71 do not adhere to the inside of an opening of the edge cover 15 located adjacent in the X axis direction to the opening of the edge cover 15 located substantially directly above the mask opening 71 (specifically, such that color mixing does not occur).

Light emission of the organic EL element occurs only in the openings of the edge cover 15. Accordingly, as described above, if the thickness of the coating films 90 is constant in the openings of the edge cover 15 and color mixing does not occur in the openings of the edge cover 15, light emission in pixels becomes constant and brightness variations or the like will not occur.

In the present embodiment as well, the vapor deposition particles 91 are blocked by the limiting plates 81, and therefore the density of vapor deposition particles 91 that pass through a mask opening 71 whose distance to the limiting plate 81 in the X axis direction is short becomes relatively small. Accordingly, as described in Embodiment 1, it is preferable to set the length (in other words, dimension in the Y axis direction) of the mask openings 71 such that the length of the mask opening 71 is longer as the distance from the mask opening 71 to the limiting plate 81 in the X axis direction is shorter. With this configuration, a plurality of stripe-shaped coating films 90 having the same thickness can be easily formed on the deposition surface 10e of the substrate 10.

Also, because the vapor deposition particles 91 are blocked by the limiting plates 81, the relative positional relationship in the X axis direction between a mask opening 71 and the coating film 90 formed by the mask opening 71 may be different between a mask opening 71 whose distance to the limiting plate 81 in the X axis direction is short and a mask opening 71 whose distance to the limiting plate 81 in the X axis direction is long. Accordingly, the position in the X axis direction of a plurality of mask openings 71 is set such that the coating films 90 are formed on the substrate 10 at an equal interval. The position in the X axis direction of each mask opening 71 can be easily obtained by geometric calculations in consideration of the relative positional relationship between the vapor deposition source opening 63, the vapor deposition mask 70 and the substrate 10, the thickness of the vapor deposition mask 70, the shape of the inner circumferential surface of the mask openings 71 on an XZ cross section, the position in the X axis direction of a plurality of coating films 90 that are to be formed, and the like.

According to the present embodiment, the area of the vapor deposition source opening 63 can be set larger than that of the vapor deposition source openings 61 of Embodiment 1, and thus the amount of vapor deposition particles discharged from the vapor deposition source opening 63 is increased. Accordingly, the deposition rate can be improved, and throughput for mass production can be improved.

Also, because the vapor deposition source opening 63 is a slit-shaped opening extending in the X axis direction, the positional accuracy in the X axis direction of the vapor deposition source 60 with respect to the plurality of limiting plates 81 and the vapor deposition mask 70 can be relaxed. Accordingly, assembly of the vapor deposition unit 50 becomes easy.

In FIG. 25, a single slit-shaped vapor deposition source opening 63 that is longer than the distance between two outermost limiting plates 81 of a plurality of limiting plates 81 aligned in the X axis direction is used, but the present invention is not limited thereto. For example, a plurality of slit-shaped vapor deposition source openings extending in the X axis direction may be linearly aligned in the X axis direction. Also, a plurality of slit-shaped vapor deposition source openings extending in the X axis direction may be arranged at different positions in the Y axis direction.

The shape of the vapor deposition source opening 63 may be a substantially rectangular or elongated elliptical shape whose longitudinal direction corresponds to the X axis direction by widening the width of the vapor deposition source opening 63 in the Y axis direction. This further increases the amount of vapor deposition particles discharged from the vapor deposition source opening 63.

The present embodiment is the same as Embodiment 1 except for the above-described differences, and produces the same effects as those of Embodiment 1. Also, various modifications mentioned in Embodiment 1 can also be applied to the present embodiment directly or by making an additional change where appropriate.

The shape of the vapor deposition source opening 63 illustrated in the present embodiment is applicable to Embodiments 1 to 6 described above, and in this case, the effects described above can be obtained.

The embodiments described above are merely intended to illustrate the technological content of the present invention, and the present invention is not construed to be limited to the specific examples. Various modifications are possible within the scope of the appended claims and the spirit of the invention, and the present invention should be interpreted broadly.

INDUSTRIAL APPLICABILITY

The present invention can be applied to any fields without any particular limitations and can be used in various devices that use organic EL elements. In particular, the present invention is preferably used in organic EL displays.

DESCRIPTION OF SYMBOLS 23R, 23G, 23B Light Emitting Layer
10 Substrate
10e Deposition Surface
50 Vapor Deposition Unit
51 Vapor Deposition Block
60 Vapor Deposition Source
61, 62, 63 Vapor Deposition Source Opening
70 Vapor Deposition Mask
71, 76 Mask Opening
75 Mask Opening column
81, 86 Limiting Plate
85 Limiting Plate Block
82, 82a, 82b, 82c Second Limiting Plate
90 Coating Film
91 Vapor Deposition Particle

The invention claimed is:
1. A manufacturing method for an organic EL element including a coating film having a predetermined pattern on a substrate, the method comprising:
a vapor deposition step of forming the coating film by causing vapor deposition particles to adhere to the substrate,
wherein the vapor deposition step is a step in which with the use of a vapor deposition unit including a vapor deposition source having a vapor deposition source opening that discharges the vapor deposition particles and a vapor deposition mask disposed between the vapor deposition source opening and the substrate, in a state in which the substrate and the vapor deposition mask are spaced apart at a fixed interval, the vapor deposition particles that have passed through a plurality of mask openings formed in the vapor deposition mask are caused to adhere to the substrate while one of the substrate and the vapor deposition unit is moved relative to the other,
when a relative movement direction between the substrate and the vapor deposition unit is defined as a first direction and a direction orthogonal to the first direction is defined as a second direction, the vapor deposition unit includes, between the vapor deposition source opening and the vapor deposition mask, a plurality of limiting plates whose positions in the second direction are different,
each of the plurality of limiting plates limits an incidence angle of the vapor deposition particles entering the respective mask openings, as viewed in the first direction,
the vapor deposition unit further includes a second limiting plate between the vapor deposition source openings and the vapor deposition mask,
the second limiting plate prevents vapor deposition particles discharged from the vapor deposition source openings on one side of the second limiting plate in the first direction from entering the mask openings disposed on the other side in the first direction, and wherein the second limiting plate is bent in a zigzag pattern.

2. The manufacturing method for an organic EL element according to claim 1, wherein the limiting plate prevents vapor deposition particles discharged from the vapor deposition source opening on one side of the limiting plate in the second direction from entering the mask opening disposed on the other side in the second direction.

3. The manufacturing method for an organic EL element according to claim 1, wherein the vapor deposition source opening is disposed between neighboring limiting plates in the second direction.

4. The manufacturing method for an organic EL element according to claim 1, wherein the number of the vapor deposition source opening is more than one, and the plurality of vapor deposition source openings and the plurality of limiting plates have substantially the same pitch in the second direction.

5. The manufacturing method for an organic EL element according to claim 1, wherein a width in the second direction of each of the plurality of mask openings disposed between neighboring limiting plates in the second direction increases as the mask opening is located farther away in the second direction from a position in the second direction of the vapor deposition source opening disposed between the neighboring limiting plates in the second direction.

6. The manufacturing method for an organic EL element according to claim 1, wherein a length in the first direction of each of the plurality of mask openings disposed between neighboring limiting plates in the second direction increases as the mask opening is located farther away in the second direction from a position in the second direction of the vapor deposition source opening disposed between the neighboring limiting plates in the second direction.

7. The manufacturing method for an organic EL element according to claim 1, wherein a plurality of the vapor deposition source openings are arranged in a plurality of columns whose positions in the first direction are different, and the plurality of mask openings and the plurality of limiting plates are disposed in the plurality of columns so as to correspond to positions of the plurality of vapor deposition source openings.

8. The manufacturing method for an organic EL element according to claim 7, wherein at least one of the plurality of columns is different from at least another column, with respect to positions in the second direction of the vapor deposition source openings, the mask openings and the limiting plates.

9. The manufacturing method for an organic EL element according to claim 7, wherein in two neighboring columns in the first direction out of the plurality of columns, the plurality of vapor deposition source openings are arranged in a staggered manner.

10. The manufacturing method for an organic EL element according to claim 7, wherein a pitch in the first direction of the vapor deposition source openings is not constant.

11. The manufacturing method for an organic EL element according to claim 7, wherein the vapor deposition particles that have passed through at least two mask openings belonging to at least two of the plurality of columns form a common coating film on the substrate.

12. The manufacturing method for an organic EL element according to claim 1, wherein at least a part of the plurality of limiting plates is cooled.

13. The manufacturing method for an organic EL element according to claim 1, wherein a thickness in the second direction of the limiting plates is greater than an interval between neighboring limiting plates in the second direction.

14. The manufacturing method for an organic EL element according to claim 1, wherein a plurality of mask opening columns whose positions in the second direction are different are disposed between neighboring limiting plates in the second direction, and the plurality of mask opening columns each include a plurality of mask openings disposed in the first direction.

15. The manufacturing method for an organic EL element according to claim 14, wherein a total dimension in the first direction of the plurality of mask openings included in each of the plurality of mask opening columns increases as the mask opening column is located farther away in the second direction from a position in the second direction of the vapor deposition source opening disposed between neighboring limiting plates in the second direction.

16. The manufacturing method for an organic EL element according to claim 1, wherein the vapor deposition source opening is a slit-shaped opening extending in the first direction.

17. The manufacturing method for an organic EL element according to claim 1, wherein the vapor deposition source opening is provided so as to extend across the limiting plates in the second direction.

* * * * *